US012588220B2

(12) United States Patent
Barraud et al.

(10) Patent No.: US 12,588,220 B2
(45) Date of Patent: Mar. 24, 2026

(54) 1TIR MEMORY WITH A 3D STRUCTURE

(71) Applicant: COMMISSARIAT A L'ENERGIE ATOMIQUE ET AUX ENERGIES ALTERNATIVES, Paris (FR)

(72) Inventors: Sylvain Barraud, Grenoble Cedex (FR); François Andrieu, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 688 days.

(21) Appl. No.: 17/663,541

(22) Filed: May 16, 2022

(65) Prior Publication Data

US 2022/0415967 A1 Dec. 29, 2022

(30) Foreign Application Priority Data

May 20, 2021 (FR) ...................................... 21 05264

(51) Int. Cl.
*H10B 63/00* (2023.01)
*G11C 5/06* (2006.01)
(Continued)

(52) U.S. Cl.
CPC ........... *H10B 63/845* (2023.02); *G11C 5/063* (2013.01); *H10B 51/10* (2023.02); *H10B 51/20* (2023.02);
(Continued)

(58) Field of Classification Search
CPC ........ H10B 51/10; H10B 51/20; H10B 51/30; H10B 61/22; H10B 63/30;
(Continued)

(56) References Cited

U.S. PATENT DOCUMENTS

| 8,026,521 B1 | 9/2011 | Or-Bach et al. |
| 2009/0218558 A1* | 9/2009 | Park ...................... H10B 63/845 |
| | | 257/E47.001 |

(Continued)

FOREIGN PATENT DOCUMENTS

FR 3079656 A1 * 10/2019 ........... H10D 62/121

OTHER PUBLICATIONS

French Preliminary Search Report Issued Mar. 1, 2022 in French Application 21 05264 filed on May 20, 2021 (with English Translation of Categories of Cited Documents), 2 pages.

*Primary Examiner* — Britt Hanley
*Assistant Examiner* — Jason James Greaving
(74) *Attorney, Agent, or Firm* — Oblon, McClelland, Maier & Neustadt, L.L.P.

(57) ABSTRACT

A memory is structured in lines and columns over several superimposed levels. Each level includes an array of memory elements and gate-all-around access transistors, each transistor including a semiconductor nanowire and each gate being insulated from the gates of the other levels. The memory also includes conductive portions, each crossing at least two levels and coupled to first ends of the nanowires of one column of the levels; memory stacks, each crossing the levels and coupled to second ends of the nanowires of the column; first conductive lines, each connected to the conductive portions of the same column; and word lines each extending in the same level while coupling together the gates of the same line and located in said level.

14 Claims, 19 Drawing Sheets

(51) Int. Cl.

| | |
|---|---|
| *H10B 51/10* | (2023.01) |
| *H10B 51/20* | (2023.01) |
| *H10B 51/30* | (2023.01) |
| *H10B 61/00* | (2023.01) |
| *H10D 30/01* | (2025.01) |
| *H10D 30/67* | (2025.01) |
| *H10D 62/10* | (2025.01) |
| *H10N 50/01* | (2023.01) |
| *H10N 50/10* | (2023.01) |
| *H10N 50/80* | (2023.01) |
| *H10N 70/00* | (2023.01) |
| *H10N 70/20* | (2023.01) |

(52) U.S. Cl.
  CPC ............. *H10B 51/30* (2023.02); *H10B 61/22* (2023.02); *H10B 63/30* (2023.02); *H10D 30/0323* (2025.01); *H10D 30/6731* (2025.01); *H10D 30/6735* (2025.01); *H10D 30/6744* (2025.01); *H10D 30/6745* (2025.01); *H10D 30/6755* (2025.01); *H10D 62/118* (2025.01); *H10N 50/01* (2023.02); *H10N 50/10* (2023.02); *H10N 50/80* (2023.02); *H10N 70/021* (2023.02); *H10N 70/231* (2023.02); *H10N 70/253* (2023.02)

(58) Field of Classification Search
  CPC ....... H10B 63/80–845; H10D 30/0323; H10D 30/6744; H10D 30/6745; H10D 30/6755
  See application file for complete search history.

(56) References Cited

U.S. PATENT DOCUMENTS

| | | | |
|---|---|---|---|
| 2014/0054538 A1 | 2/2014 | Park | |
| 2016/0225849 A1* | 8/2016 | Wong ................. | H01L 21/3083 |
| 2017/0047376 A1 | 2/2017 | Kurotsuchi et al. | |
| 2017/0092541 A1 | 3/2017 | Or-Bach et al. | |
| 2022/0013532 A1* | 1/2022 | Young ................... | H10B 41/27 |
| 2022/0320141 A1* | 10/2022 | Lin ....................... | H10B 51/50 |

* cited by examiner

1T1R MEMORY WITH A 3D STRUCTURE

TECHNICAL FIELD

This document relates to the field of memories, in particular that of non-volatile RAM memories, or NVRAM standing for "Non-Volatile Random-Access Memory", of the 1T1R type (i.e. wherein each memory element, or memory point, is coupled to an access transistor) and with a 3D structure (i.e. including several superimposed levels in each of which an array of memory elements is located).

PRIOR ART

In the field of memories, there is a need for finding a trade-off between storage capacity, speed and cost. HDD ("Hard Disk Drive") and SSD ("Solid-State Drive") type memories offer considerable storage capacities for a reasonable cost, but a low operating speed. Conversely, DRAM ("Dynamic Random Access Memory") or SRAM ("Static Random Access Memory") type volatile memories allow reaching much more considerable operating speeds, but the storage capacities are low.

Halfway between these two memory types, there are the SCM, or "Storage Class Memory", type memories. This memory type covers different technologies, and in particular NVRAM memories such as RRAM or "Resistive Random-Access Memory", MRAM or "Magnetoresistive Random-Access Memory", PCRAM or "Phase-Change Random Access Memory" or still Fe-RAM or "Ferroelectric Random-Access Memory" type memories. With this memory type, it is considered to provide densities with more considerable densities than current DRAM memories while being quicker and less expensive than FLASH NAND memories.

A conventional NVRAM memory structure is the so-called "Crossbar" architecture wherein an array of memory elements is controlled by a network of bit, source and word lines, the word lines being directed perpendicularly to the bit lines and to the source lines. In such a structure, each memory element may be coupled to an access transistor (1T1R structure) to avoid leakage currents between the memory elements as well as interferences therebetween. Nonetheless, the access transistors are bulky and limit the achievable maximum density of memory elements in a given volume.

The document US 2017/0092541 A1 describes a NVRAM memory with a 3D structure and comprising stacked semiconductor nanowires to form junctionless access transistors. In the structure suggested in this document, the gates of the transistors are not in direct contact on the active areas that represent the SL ("sourceline") regions, which limits the achievable density of memory elements because the distance between the gates and the active areas should be large enough to enable etching of these gates. Furthermore, since the gates cover only two sides of each nanowire, a low current level per nanowire is obtained to write the memory elements, as well as a low electrostatic control level of the transistors (and therefore higher leakage currents are expected when the transistor will be in an on-state). In addition, the gates are common to all of the stacked nanowires, which implies carrying out a separate contact resumption between the different wire levels in the SL region. Such contact resumption often results in large line lengths, and therefore high access resistances which could considerably reduce the current output by the transistor, which might prevent writing in the memory point.

Furthermore, the source lines are made within the stack used for making the transistors, before etching of the gates, which implies that the distances between these lines should be large enough to be able to dispose two transistor gates between two consecutive SL lines. The drawing rules setting the minimum distance between the gate and the active area are an obstacle for the obtainment of a regular and dense design. Finally, the source lines are made of doped silicon, and therefore very resistive and contributing to the previously-described drawbacks.

The document US 2014/0054538 A1 describes a NVRAM memory with a 3D structure and comprising stacked semiconductor nanowires to form TFET-type (tunnel-FET) access transistors. Herein again, the gates cover only two sides of each semiconductor nanowire, which results in a loss of the effective width and therefore a loss of current per unit surface. Furthermore, the superimposed semiconductor nanowires are connected together on the source side of the transistors. Hence, the formed stack does not benefit from the increase in the total number of memory elements. In addition, the regions in which are formed the memory elements are made before the control gates of the transistors that will serve as a memory element selector. Because of lithography-related misalignment, the distances between the memory elements and the gates are not always the same, which poses a problem of design variability and irregularity.

The document US 2009/0218558 A1 describes a NVRAM memory with a 3D structure and comprising stacked transistors. In this memory, the planar structure of the gates of the transistors requires having gates that are long enough to have a proper electrostatic control of the transistors, which is a constraint for the achievable density of memory elements. Furthermore, since making of this memory is based on a monolithic 3D integration, the transistors are made separately between each level, and the self-alignment of the stacked structures is not guaranteed. This might be problematic for obtaining a regular design of the memory. Thus, the density is also affected.

Other NVRAM memories with a 3D structure and with stacked semiconductor nanowires have been suggested. When these structures include long semiconductor or metallic lines of bits formed within the same stack as that used for making the semiconductor nanowires, these lines are very resistive, which poses a problem to obtain the same drive current for all transistors.

DISCLOSURE OF THE INVENTION

Therefor there is a need to provide a memory, for example a NVRAM-type one, with a 3D structure devoid of the drawbacks of the previously-described memories of the prior art.

For this purpose, one embodiment provides a memory including a structure in lines and columns over several superimposed memory levels, each memory level comprising at least one array of memory elements and gate-all-around access transistors, each access transistor including a semiconductor nanowire at least one portion of which is embedded by a gate, each gate being electrically insulated from the gates of the access transistors of the other memory levels, the memory comprising:

first electrically-conductive portions, each crossing at least two memory levels and being electrically coupled to first ends of the semiconductor nanowires of access transistors belonging to at least one column and one line of each of said at least two memory levels;

memory stacks, each crossing said at least two memory levels and forming memory elements belonging to at least one column and one line of each of said at least two memory levels, each memory stack comprising at least one memory material layer disposed between at least one second electrically-conductive portion forming a first electrode of said memory elements and at least one electrically-conductive layer forming a second electrode of said memory elements, the electrically-conductive layer being disposed against second ends of the semiconductor nanowires of said access transistors;

first electrically-conductive lines, each being electrically connected to the first electrically-conductive portions of the same column of the memory;

second electrically-conductive lines, each being electrically connected to the second electrically-conductive portions of the same column of the memory;

word lines each extending in the same memory level corresponding to one of said at least two memory levels while electrically coupling together the gates of the access transistors of the same line of the memory and located in said memory level.

This memory involves Gate-All Around, or GAA, transistors, which promotes the obtainment of a high density of memory elements within the memory, a considerable electrostatic control level of the transistors as well as high output current to feed in the memory elements. An all-around gate corresponds to a gate surrounding, or covering, all sides of the nanowire at least at the channel region of the transistor. In the case of a nanowire with a rectangular section, an all-around gate covers the 4 sides, or lateral faces, of the nanowire.

In this memory, because the gates of the transistors are electrically insulated from each other from one level to another, the transistors are controllable independently for each memory level, which enables an independent addressing of the memory elements of each memory level.

In this structure, the first and second electrically-conductive lines, intended to form the source and bit lines of the memory element arrays, are not made within the memory levels, thus creating no constraint on the drawing rules applicable to this memory and avoiding having to make very resistive source or bit lines.

In this memory, each of the source lines and of the bit lines, formed by the first and second electrically-conductive lines, is common to all of the memory levels and to all of the memory elements and access transistors of the same column of the memory. Conversely, the word lines, controlling the access transistors, are independent for each memory level and for the different lines of the memory.

Throughout the entire document, the term "over" is used without distinction of the orientation in the space of the element to which this term refers. For example, in the feature "over a face", this face is not necessarily directed upwards but could correspond to a face directed to any direction. Furthermore, the arrangement of a first element over a second element should be understood as being able to correspond to the arrangement of the first element directly against the second element, without any intermediate element between the first and second elements, or else as being able to correspond to the arrangement of the first element over the second element with one or several intermediate element(s) disposed between the first and second elements.

Throughout the entire document, the terms "line" and "column" have been arbitrarily selected. In one plane, the term "column" is generally associated to a vertical arrangement. Nonetheless, these terms should not be interpreted only according to this arrangement, but as referring, in one plane, to two different orientations, in general substantially perpendicular to each other. For example, the term "line" may be associated, in one plane, to a vertical arrangement, and the term "column" may be associated to a horizontal arrangement.

Throughout the entire document, the term "nanowire" is used to refer to a conductive element with a thickness smaller than about 20 nm, and whose width may be equal to or larger than this thickness. Throughout the entire document, the term "nanowire" should be understood as synonym of the term "nanosheet".

The term "stack" refers to a succession of several elements according to one or several direction(s).

The electrical coupling between the first electrically-conductive portions and the first ends of the semiconductor nanowires may correspond to a metal-semiconductor contact between the first electrically-conductive portions and the first ends of the semiconductor nanowires.

The memory may correspond to a NVRAM memory.

The semiconductor nanowires of the access transistors may include polycrystalline or monocrystalline silicon or metal oxide ($In_2O_3$ for example) or at least one semiconductor 2D material (for example a dichalcogenide of transition metals such as $MoS_2$ or $WSe_2$). The expression "2D material", or two-dimensional material, refers to a material consisting of a leaf, or a stack of leaves, with a thickness of a few atoms, typically a maximum of 10 atoms. A 2D material is electronically saturated, and a stack of several leaves is obtained thanks to Van der Waals bonds between the atom layers. Amongst the 2D materials, some are semiconductor. Their very small thickness gives rise to special electronic, optoelectronic and mechanical properties.

The memory material may correspond to a resistive or magnetoresistive or phase-change or ferroelectric material.

In the memory, the number of memory levels may be comprised between two and one hundred, and preferably greater than or equal to three.

Each of the word lines of a memory line may be electrically insulated from the other word lines belonging to said line of the memory. In other words, in one line of the memory, the word lines distributed in the different memory levels are electrically insulated from each other.

In this case, the memory may include, in each line of the memory, gate electrical contacts each electrically coupled to one of the word lines of one of the memory levels, located at one end of said line of the memory and electrically insulated from each other.

Each of the word lines of one line of the memory may be electrically insulated from the word lines belonging to the other lines of the memory.

The first and second electrically-conductive lines may belong to interconnection metallic levels distinct from the memory levels.

The memory may further include insulation dielectric portions interposed between superimposed gates and disposed in two neighbouring memory levels.

The memory may include insulation dielectric elements crossing all memory levels and each separating two neighbouring lines of the memory.

In an advantageous configuration:

each of the first electrically-conductive portions could cross all memory levels and be electrically coupled to the first ends of the semiconductor nanowires of access transistors of each of the memory levels;

each of the memory stacks crosses all memory levels and forms memory elements of each of the memory levels;

the word lines extend in each of the memory levels.

Another embodiment relates to a method for making a memory including at least:

making of a stack of first, second and third layers, each second layer being disposed between two third layers and in contact with these two third layers, and each third layer being in contact with one of the first layers, the first layers including a semiconductor material, the second layers including a material that could be etched selectively with regards to the materials of the first and third layers, and the third layers including a material that could be etched selectively with regards to the materials of the first and second layers;

etching of first cavities through at least one portion of the thickness of the stack, aligned while forming lines and columns;

etching of portions of the second layers located between the first cavities of the same line;

making of insulation dielectric portions in spaces formed by etching of said portions of the second layers, and configured to ensure an electrical insulation between different memory levels;

etching of trenches throughout the entire thickness of the stack, separating and insulating portions of the stack each including a line of first cavities;

partial etching of the first layers starting from the trenches, such that remaining portions of the first semiconductor layers located between the first cavities form semiconductor nanowires;

etching of the third layers of the stack;

deposition of at least one gate dielectric and at least one gate conductive material in spaces formed by etching of the third layers of the stack, forming an all-around gate around at least one portion of each of the semiconductor nanowires and of the word lines each extending in the same memory level corresponding to one of the memory levels while electrically coupling together the gates of the same line and located in said one of the memory levels;

deposition of a dielectric material in the trenches;

making of first electrically-conductive portions in one portion of the first cavities such that each crosses at least two memory levels and is electrically coupled to first ends of the semiconductor nanowires at least at one lateral face of said first electrically-conductive portion;

making of a memory stack in the other first cavities, each crossing said at least two memory levels and comprising at least one memory material layer disposed between at least one second electrically-conductive portion and at least one electrically-conductive layer disposed against second ends of the semiconductor nanowires;

making of first electrically-conductive lines such that each is electrically connected to the first electrically-conductive portions of the same column of the memory, and making of second electrically-conductive lines such that each is electrically connected to the second electrically-conductive portions of the same column of the memory.

Advantageously, the method may be such that:

the first layers include silicon, the second and third layers include SiGe, and the germanium content in the SiGe of the second layers is different from the germanium content in the SiGe of the third layers.

The method may further include, between making of the insulation dielectric portions and etching of the trenches, a partial etching of the third layers of the stack starting from the lateral walls of the first cavities, then making of inner dielectric spacers in spaces formed by the partial etching of the third layers.

The method may further include, between making of the insulation dielectric portions and etching of the trenches, a deposition of a sacrificial material in the first cavities, this sacrificial material being suppressed before making of the first and second electrically-conductive portions.

The step of etching the first cavities may also form second cavities throughout the entire thickness of the stack and each located at one end of a line of first cavities, and the method may include a step of making gate electrical contacts in the second cavities, each electrically coupled to a word line of one of the memory levels and electrically insulated from each other.

BRIEF DESCRIPTION OF THE DRAWINGS

The present invention will be better understood upon reading the description of embodiments given for merely indicative and non-limiting purposes with reference to the appended drawings wherein.

Identical, similar or equivalent portions of the different figures described hereinafter bear the same reference numerals so as to facilitate switching from one figure to another.

The different portions shown in the figures are not necessarily to a uniform scale, in order to make the figures more readable.

The different possibilities (variants and embodiments) should not be understood as exclusive of each other and could be combined together.

DETAILED DISCLOSURE OF PARTICULAR EMBODIMENTS

Figure 1:
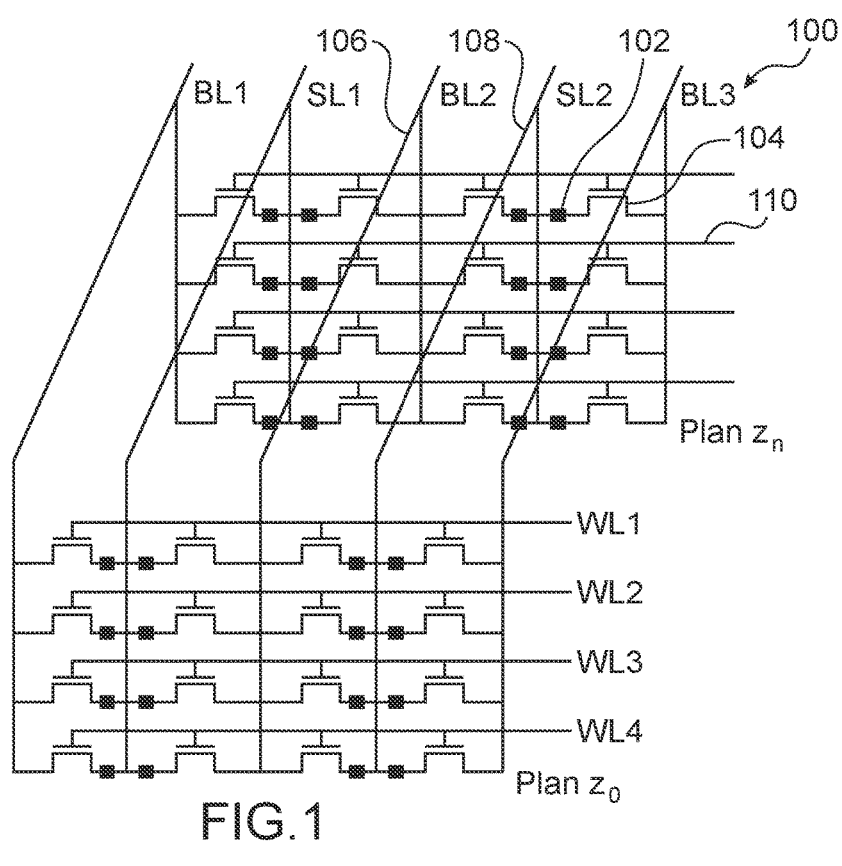
FIG. 1 shows an electrical diagram of a memory according to a particular embodiment.
Figure 2:
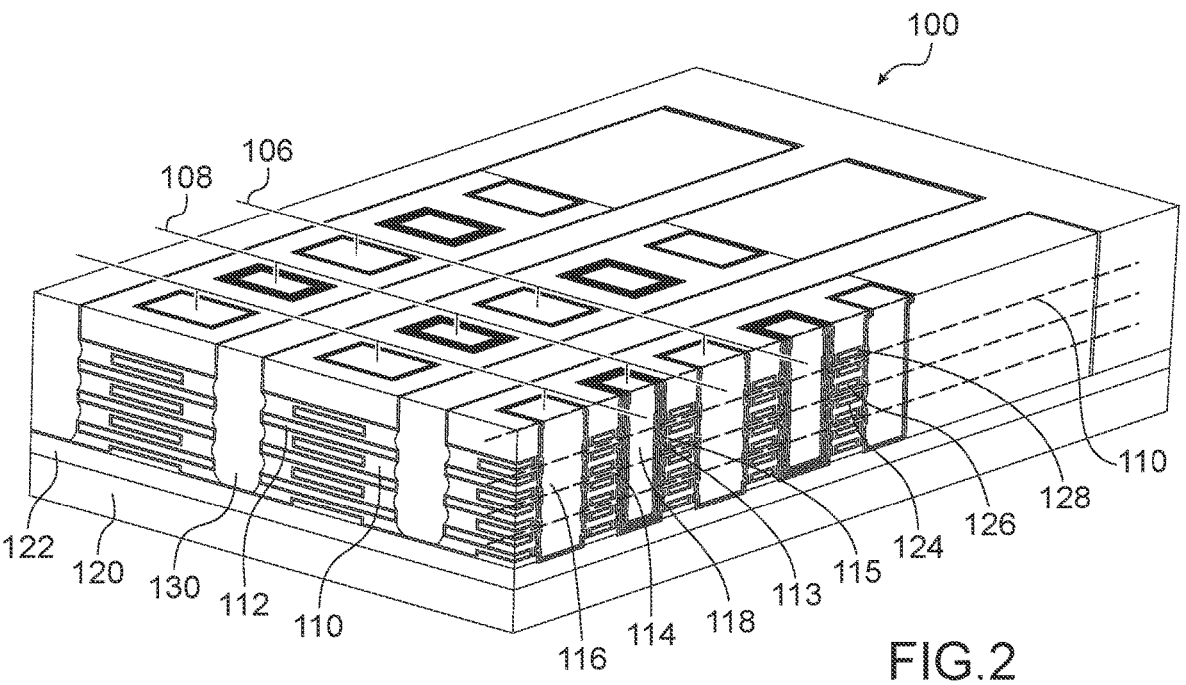
FIG. 2 schematically shows an embodiment of a memory according to a particular embodiment.

A memory 100, for example NVRAM, according to a particular embodiment is described hereinbelow with reference to FIGS. 1 and 2. FIG. 1 shows an electrical diagram of the memory 100 in this particular embodiment, and FIG. 2 schematically shows an example of the memory 100 in this particular embodiment.

The memory 100 is made in the form of a 3D structure arranged in lines and in columns, and comprising several superimposed memory levels (four in the example described herein). The memory 100 includes several arrays of memory elements 102 and gate-all-around access transistors 104 superimposed on top of each other, each arranged in one of the memory levels. In each of these arrays, each memory element 102 is electrically coupled to an access transistor 104 associated only to this memory element 102.

In order to facilitate the description of the memory 100, the expression "3D line" of memory elements 102 or access transistors 104 is used to refer to all of the memory elements 102 or access transistors 104 of one line of each of the arrays of the memory 100 and which are superimposed on top of each other. Similarly, the expression "3D column" of memory elements 102 or access transistors 104 is used to refer to all of the memory elements 102 or access transistors 104 of one column of each of the arrays of the memory 100 and which are superimposed on top of each other.

The memory 100 includes first electrically-conductive lines 106 and second electrically-conductive lines 108 respectively forming, in the embodiment described herein, bit lines and source lines. Alternatively, the first and second electrically-conductive lines 106, 108 could respectively form the source lines and the bit lines of the memory 100. Each of the first and second electrically-conductive lines 106, 108 is common to all of the memory levels and to all of the memory elements 102 and access transistors 104 of the same column of the memory 100. For example, the first and second electrically-conductive lines 106, 108 are made in interconnection metallic levels distinct from the memory levels.

More particularly, in the embodiment described herein, each of the first electrically-conductive lines 106 is coupled to a first source or drain electrode of each of the access transistors 104 of two neighbouring 3D columns of access transistors 104 (except for the first electrically-conductive lines 106 located at the edge of the memory 100 each of which is coupled to a first source or drain electrode of each of the access transistors 104 of one single 3D column of access transistors 104). In addition, each of the second electrically-conductive lines 108 is coupled to a first electrode of each of the memory elements 102 of two neighbouring 3D columns of memory elements 102.

A second electrode of each of the memory elements 102 is electrically coupled to a second source or drain electrode of the access transistor 104 that is associated thereto.

Finally, the memory 100 includes word lines 110 which are not common to all of the memory levels, but each of which is associated to one single memory level. Each of the word lines 110 electrically connects gates of the access transistors 104 of one line of one single memory level. In FIG. 2, four word lines belonging to a 3D line of the memory 100 and distributed in all memory levels are represented by dotted lines.

Furthermore, in the memory 100, the access transistors 104 are of the GAA type and the gates of two transistors superimposed on top of each other and disposed in two neighbouring memory levels of the memory 100 are electrically insulated from each other by insulation dielectric portions 112. Each of the access transistors 104 includes a semiconductor nanowire 114 at least one portion of which forming the channel of the access transistors 104 is embedded by its gate. For example, the semiconductor of the nanowires 114 corresponds to polycrystalline or monocrystalline silicon, or metal oxide such as $In_2O_3$, or at least one 2D material such as a dichalcogenide of transition metals such as $MoS_2$ or $WSe_2$.

For example, the memory 100 includes a number of memory levels comprised between 2 and a few tens (100), and advantageously greater than or equal to 3.

For example, the length of each nanowire 114 (dimension according to the Y axis in FIG. 2) is comprised between 30 nm and 250 nm. For example, the width of each nanowire 114 (dimension according to the X axis in FIG. 2) is comprised between 10 nm and 150 nm. For example, the height of each nanowire 114 (dimension according to the Z axis in FIG. 2) is comprised between 8 nm and 30 nm.

The memory 100 includes first electrically-conductive portions 116, each crossing all levels of the memory 100. Each of the first electrically-conductive portions 116 is electrically coupled to first ends of the nanowires 114 of the access transistors 104 belonging to two neighbouring 3D columns of the memory 100 (except those located on one of the edges of the memory 100 that are electrically coupled to first ends of the nanowires 114 of the access transistors 104 belonging to one single 3D column of the memory 100). Each of the first electrically-conductive portions 116 forms the first source or drain electrodes of the access transistors 104 (source electrodes in the example described herein) the first ends of the nanowires 114 of which are electrically coupled to this first electrically-conducive portion 116. In the embodiment described herein, each first electrically-conductive portion 116 is formed by a Ti, TiN and W stack.

In the memory 100, the memory elements 102 are made in the form of memory stacks, each crossing all levels of the memory 100. Each memory stack forms memory elements distributed in all memory levels and belonging to one 3D line and to two neighbouring 3D columns of the memory 100 (except those located on one of the edges of the memory 100 which form memory elements 102 belonging to one single 3D column of the memory 100).

Each memory stack includes at least one resistive (case of a RRAM-type memory 100), or magnetoresistive (case of a MRAM-type memory 100), or phase-change (case of a PCRAM-type memory 100), or else ferroelectric (case of a F-RAM type memory 100 and in a 1T1C configuration) type memory material layer 115. In the embodiment described herein, the memory material layer 115 includes $HfO_2$, whether ferromagnetic or not, and a thickness for example comprised between 3 nm and 10 nm.

The memory material level 115 is disposed between a second electrically-conductive portion 118 forming a first electrode of the memory elements 102 and an electrically-conductive layer 113 forming a second electrode of the memory elements 102 and to which are coupled second ends of the nanowires 114 of the access transistors 104 belonging to the 3D column(s) that include(s) these memory elements 102. For example, the electrically-conductive layer 113 includes TiN or silicide (for example NiPtSi) or Si:P (highly-doped silicon). For example, the second electrically-conductive portion 118 includes a Ti layer and a TiN layer, and also possibly a W layer.

The elements forming the 3D structure of the memory 100 are disposed over a substrate. In the embodiment of FIG. 2, the substrate corresponds to a 501 substrate comprising a support layer 120, for example a silicon-based one, a buried dielectric layer 122 disposed between the support layer 120 and the nanowires 114 of the first memory level of the memory 100 and comprising for example $SiO_2$, and a semiconductor superficial layer having been used in making the nanowires 114 of the first memory level of the memory 100. The elements forming the 3D structure of the memory 100 could also be made over a solid substrate, for example of silicon.

The gates of the access transistors 104 include at least one gate dielectric material 124 covering the portions of the nanowires 114 forming the channels of the access transistors 104, and at least one gate conductive material 126 covering the gate dielectric material 124. In the embodiment described herein, the gate dielectric material 124 corresponds to a $HfO_2$ layer whose thickness is equal to 2 nm, and the gate conductive material 126 corresponds to a TiN layer whose thickness is equal to 10 nm.

Each of the access transistors 104 includes inner spacers 128 disposed between the gate and the first and second electrically-conductive portions 116, 118 forming the source and drain electrodes of this transistor. In the embodiment described herein, the inner spacers 128 include SiN.

The gates and the word lines 110 of each 3D line of the memory 100 are electrically insulated from the gates and from the word lines 110 of the neighbouring 3D lines by insulation dielectric elements 130 crossing all levels of the memory 100, extending parallel to the 3D lines of the memory 100 and separating two neighbouring lines of the memory 100.

The memory 100 also includes gate electrical contacts each electrically coupled to a word line 110 of one of the memory levels. In order to be able to access the word lines 110 of the different levels of the memory 100, the electrical contacts of the word lines 110 of each 3D line of the memory 100 are electrically insulated from each other and disposed according to a so-called "staircase"-like arrangement located at the periphery of the core of the array.

A method for making the memory 100 according to a particular embodiment is described hereinbelow with reference to FIGS. 3 to 27.

Figure 3:
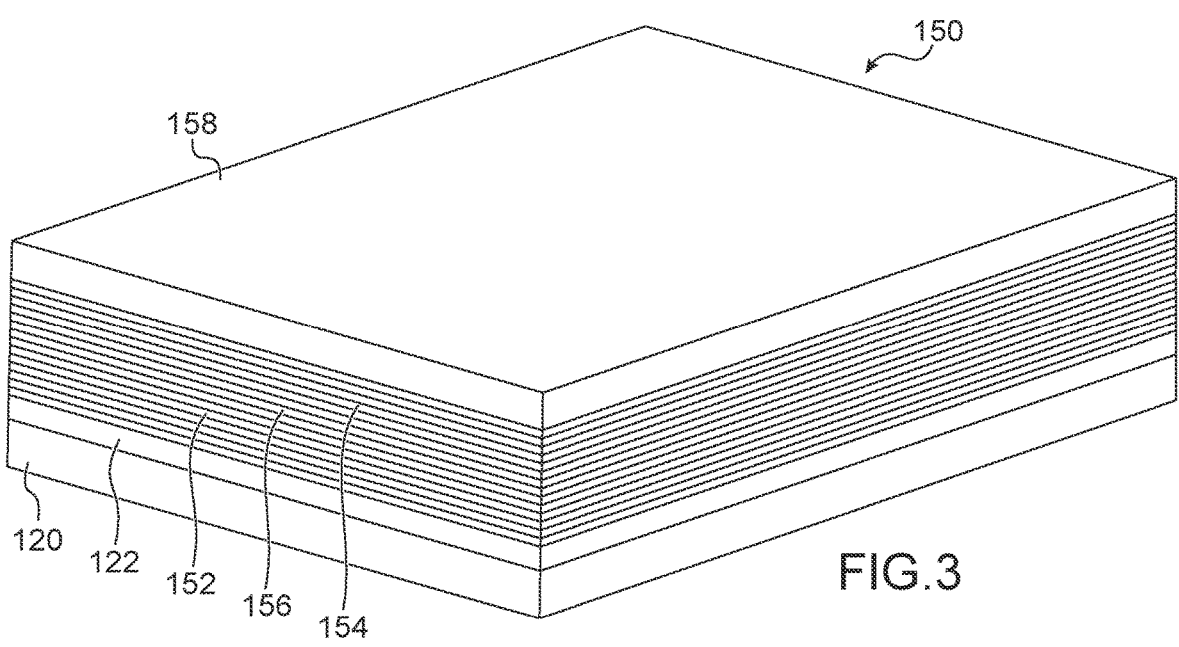
FIGS. 3 to 27 show the steps of a method for making a memory according to a particular embodiment.

A stack 150 of materials is made at first (cf. FIG. 3). This stack 150 includes several first semiconductor layers 152 intended for making of the nanowires 114 of the access transistors 104 of the memory 100. In the embodiment described herein, the first layers 152 include monocrystalline silicon.

In the example described herein, one of the first layers 152 corresponds to the superficial layer of the SOI substrate used as a support for the stack 150. This SOI substrate includes the support layer 120 and the buried dielectric layer 122 disposed between the support layer 120 and said one of the first layers 152.

The stack 150 also includes one or several second layer(s) 154 and several third layers 156. Each second layer 154 is disposed between two third layers 156 and in contact with these two third layers 156. Each third layer 156 is in contact with one of the first layers 152.

A property of the material of the second layer 154 is to be able to be etched selectively with regards to the material of the first layers 152 and of the third layers 156. When the first layers 152 include silicon, this etching selectivity is obtained for example by making SiGe-based second layers 154 whose Ge concentration is higher than that corresponding to the SiGe layer 156. Furthermore, a property of the material of the third layers 156 is to be able to be etched selectively with regards to the material of the first layers 152. Like with the second layers 154, this etching selectivity is obtained for example by making SiGe-based third layers 156.

Furthermore, in order to enable etching the second layers 154 selectively with regards to the third layers 156, the germanium content in the semiconductors of the second and third layers 154, 156 are different. As example, the semiconductor of the second layers 154 may correspond to $Si_{0.5}Ge_{0.5}$, and the semiconductor of the third layers 156 may correspond to $Si_{0.3}Ge_{0.7}$.

Alternatively, the first layers 152 may include polycrystalline silicon. It is also possible that the second layers 154 include SiN, and/or the third layers 156 include $SiO_2$.

The first layers 152 other than that corresponding to the superficial layer of the SOI substrate, as well as the second and third layers 154, 156, are made for example by epitaxy starting from the superficial layer of the SOI substrate.

For example, the thickness of each of the first layers 152 is equal to 15 nm, or more generally comprised between about 8 nm and 30 nm. For example, the thickness of each of the second layers 154 is equal to 10 nm, or more generally comprised between about 8 nm and 50 nm. For example, the thickness of each of the third layers 156 is equal to 12 nm, or more generally comprised between about 8 nm and 30 nm.

The stack 150 is covered with a first hard mask layer 158. For example, this layer 158 includes SiN and has for example a thickness equal to 80 nm.

Figure 4:
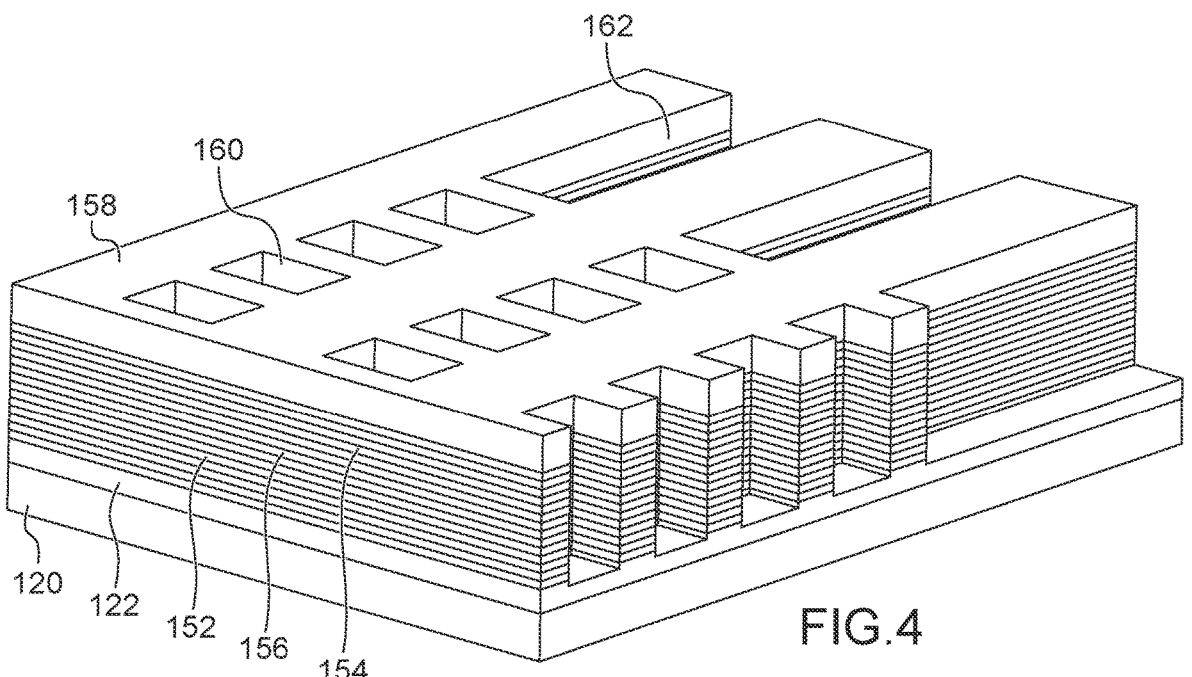

Etching is implemented throughout the entire thickness of the stack 150 (cf. FIG. 4). This etching forms first cavities 160 intended for making of the memory elements 102 and of the first and second electrically-conducive portions 116, 118. In the embodiment described herein, these first cavities 160 have, in a plane parallel to the main planes of each of the layers 152, 154, 156 (a plane parallel to the plane (X, Y)) a rectangular or circular shaped section, whose dimensions are for example comprised between 30 nm and 300 nm. The first cavities 160 are aligned while forming lines and columns.

This etching step also forms, throughout the entire thickness of the stack 150, second cavities 162, located at the periphery of the core of the array, intended for making of the electrical contacts of the gates of the access transistors 104. Afterwards, each gate contact is connected by a metallic line as shown in FIG. 1 (metallic line 110, also referred to before as word line). A second cavity 162 is made at one end of each line of first cavities 160, in order to form accesses to the gates of the access transistors 104 coupled to the memory elements 102 which will be made in the first cavities 160 of each line.

This etching step is implemented using the first hard mask layer 158 to make the etching mask. This etching is stopped on the buried dielectric layer 122.

The electrical contacts of the gates of the transistors, to which the word lines 110 are intended to be connected, may be made at the second cavities 162, for example by successively implementing lithography and etching steps so that these contacts correspond to staircase-like contacts enabling independent access to each word line 110.

Figure 5:
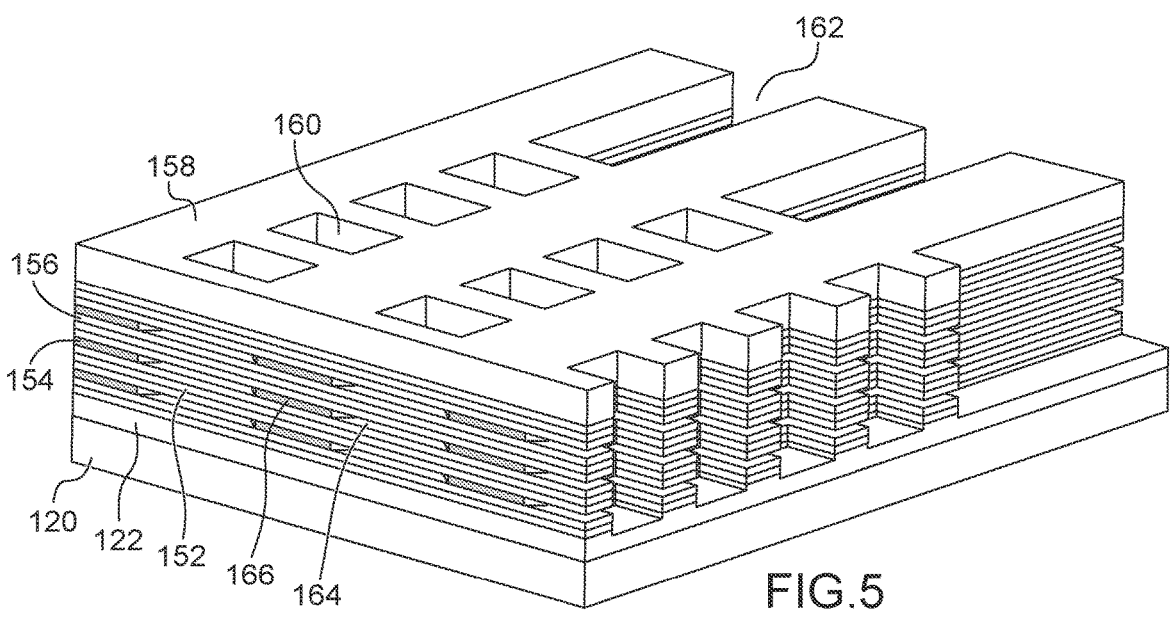

Afterwards, another etching step is implemented in order to suppress portions of the second layers 154 located between the first cavities 160 of the same line (cf. FIG. 5). In FIG. 5, the spaces formed by this etching between the third layers 156 bear the reference 164. Other portions of the second layers 154, bearing the reference 166, located between the lines of first cavities 160 are kept in order to ensure the mechanical holding of the stack 150.

Afterwards, the spaces 164 are filled with a dielectric material, for example SiN. The insulation dielectric portions deposited in the spaces 164 bear the reference 168 and are intended to electrically insulate the gates of the access transistors 104 from the different levels of the memory 100.

Afterwards, dielectric portions intended to form the inner spacers 128 of the access transistors are made.

Figure 6:
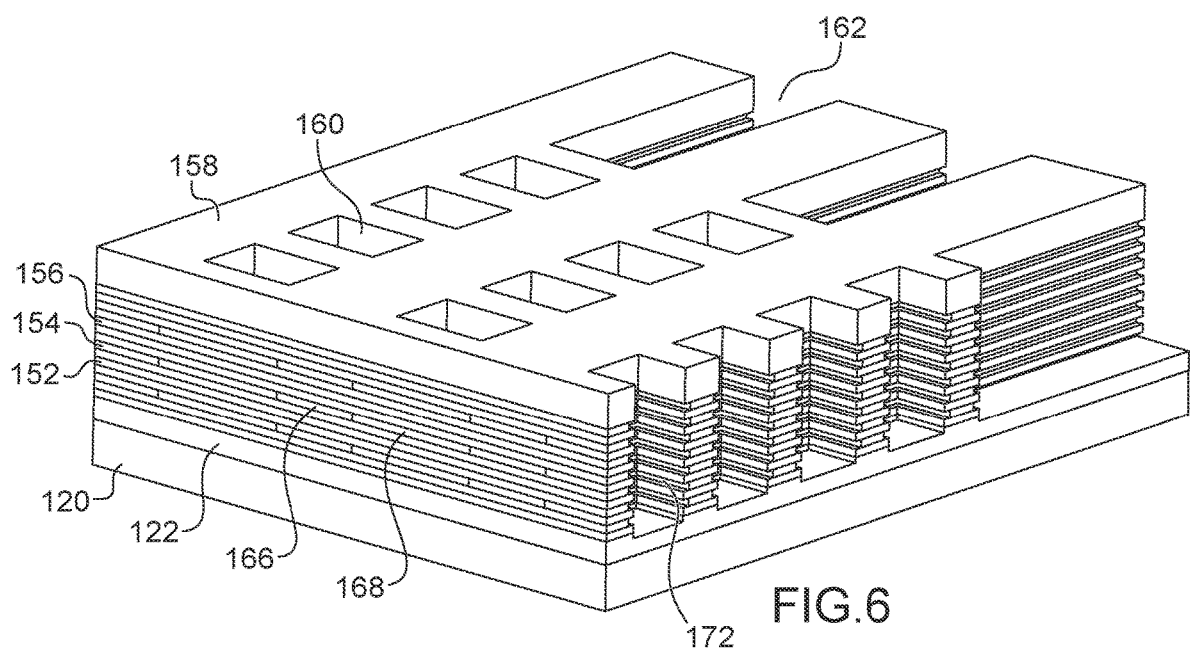
Figure 7:
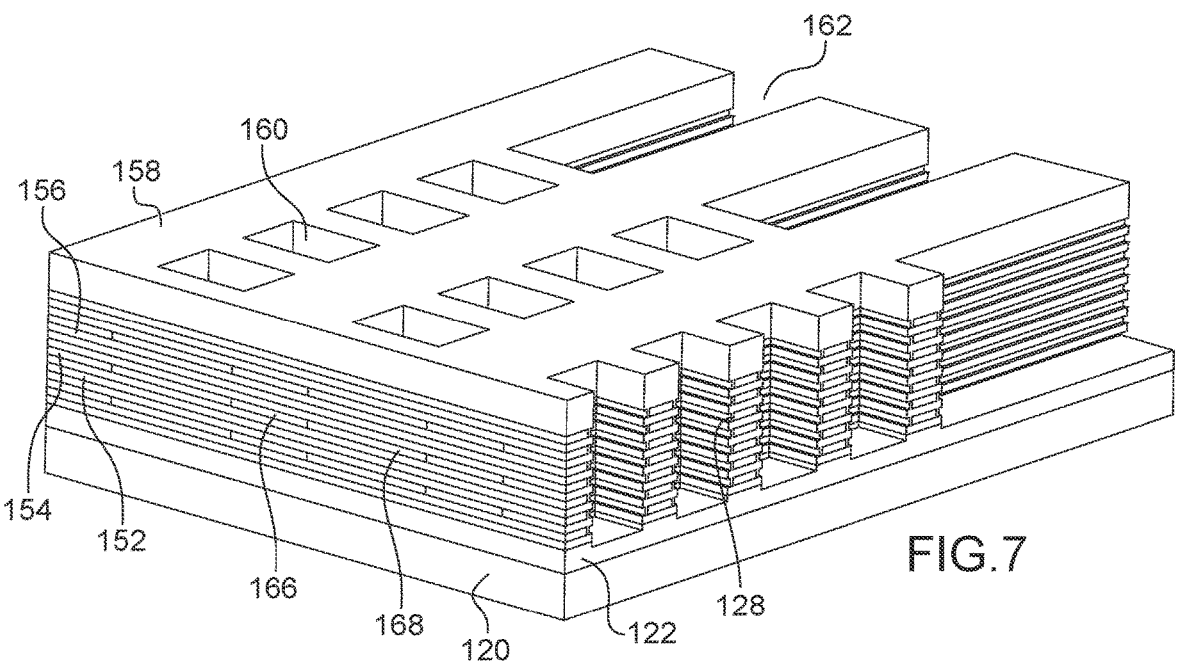

For this purpose, a selective etching of one portion of the third layers 156 is implemented. This etching is carried out so as to obtain, in the cavities 160, 162, a removal of the material of the third layers 156, with respect to the surface from which the material is etched, over a depth for example equal to 20 nm. In FIG. 6, the recesses formed in the third layers 156 bear the reference 172.

Afterwards, the dielectric material(s) intended to form the inner spacers 128 is/are deposited. In the embodiment described herein, a dielectric material layer is conformally deposited in the cavities 160, 162 so as to partially fill the recesses 172, and also covers the first hard mask layer 158. For example, this dielectric material layer includes SiN and has for example a thickness equal to 9 nm. Afterwards, a wet etching is implemented to suppress the portions of this dielectric material layer which are not located in the recesses 172 and which do not form the inner spacers 128, i.e. the portions of the dielectric material layer located against the first hard mask layer 158, at the bottom of the cavities 160,162 and against the first layers 152 (cf. FIG. 7).

Figure 8:
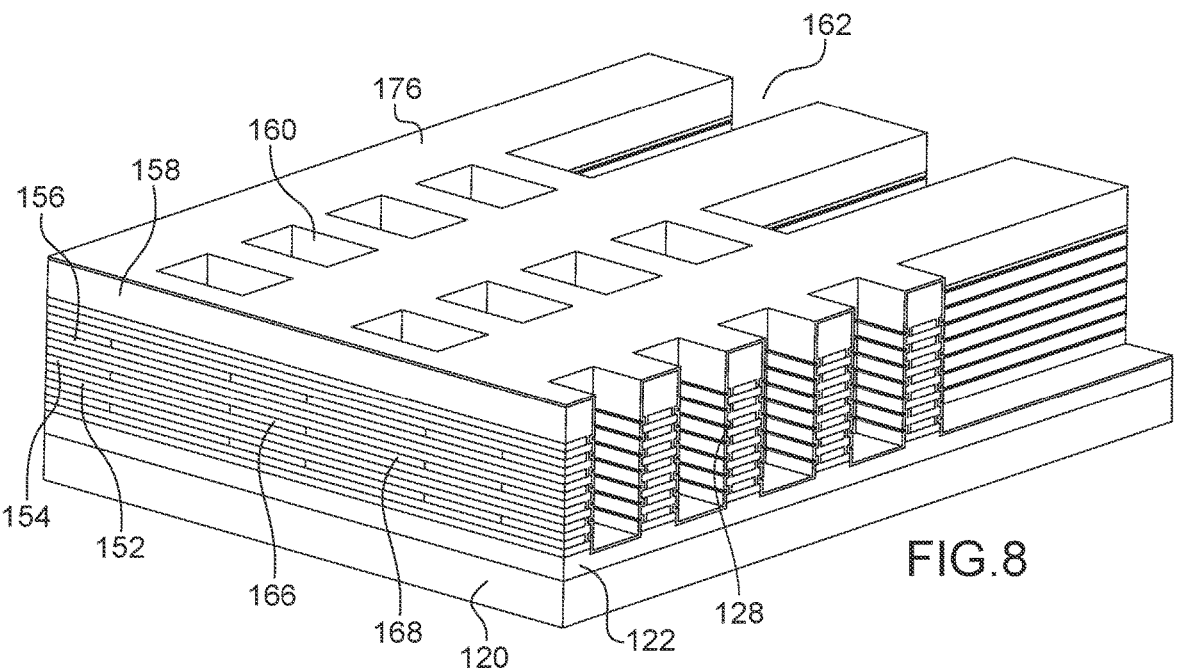

Another dielectric material layer 176 is conformally deposited in the cavities 160, 162 and over the first hard mask layer 158 (cf. FIG. 8). For example, the second dielectric material layer 176 includes TEAS tetraethoxysilane $Si(OC_2H_5)_4$ and has for example a thickness equal to 7 nm. This second dielectric material layer 176 is intended to be subsequently used as an etching stop layer.

Figures 9, 10:
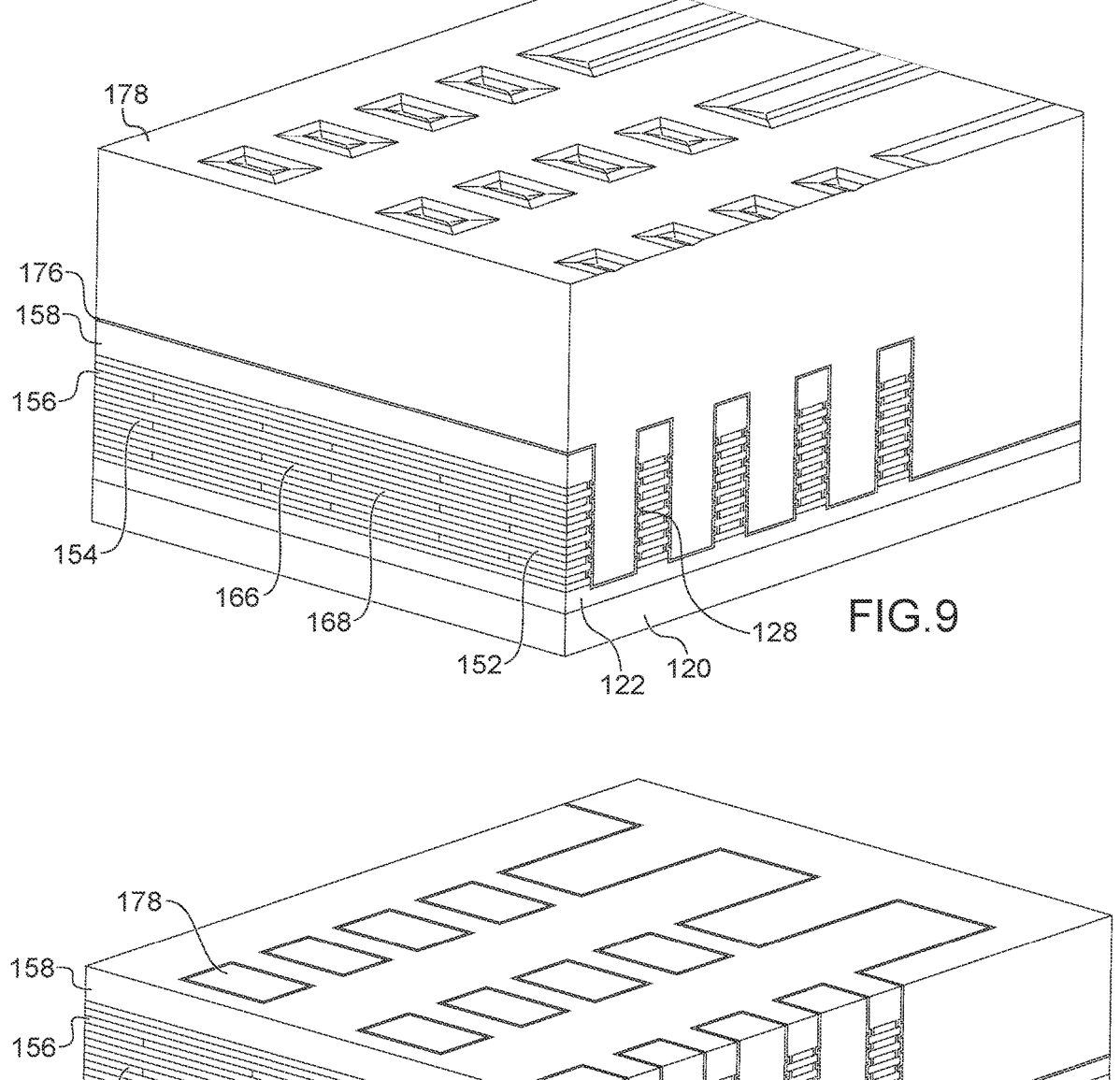

Afterwards, a sacrificial material layer 178 that could be etched selectively with regards to the material of the first hard mask layer 158 is deposited so as to fill the cavities 160, 162 (cf. FIG. 9). This sacrificial material layer 178 covers the second dielectric material layer 176. For example, the sacrificial material layer 178 includes polysilicon or SoC ("Spin-On Carbon"), or any other material that could be etched selectively with regards to the material of the first hard mask layer 158 and the material of the second dielectric material layer 176. For example, the thickness of the sacrificial material layer 178 is equal to 380 nm.

Afterwards, a chemical mechanical polishing (CMP) step is implemented with stopping on the first hard mask layer 158 in order to suppress the sacrificial material of the layer 178 located on the first hard mask layer 158 (cf. FIG. 10). Upon completion of this CMP step, only the portions of the sacrificial material layer 178 located in the cavities 160, 162 are kept.

Figure 11:
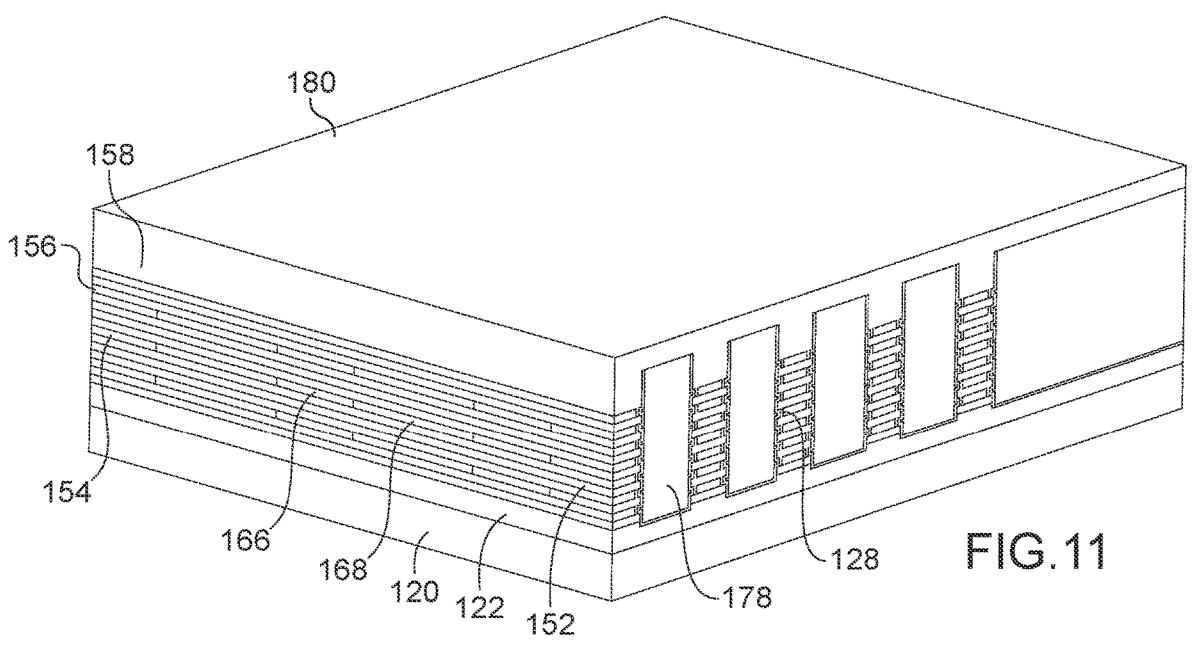

A second hard mask layer 180 is deposited over the entirety of the completed structure, thus covering the first hard mask layer 158 and the remaining portions of the sacrificial material layer 178 (cf. FIG. 11). For example, the material of the second hard mask layer 180 is similar to that of the first hard mask layer 158, i.e. herein SiN. For example, the thickness of the second hard mask layer 180 is equal to 10 nm.

Figure 12:
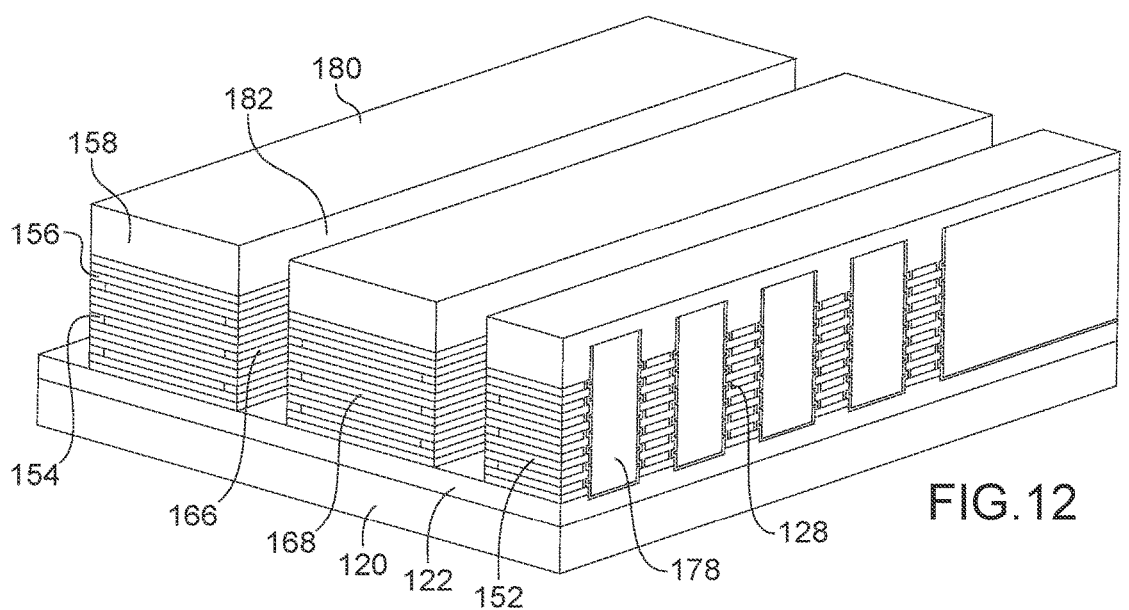
Figure 13:
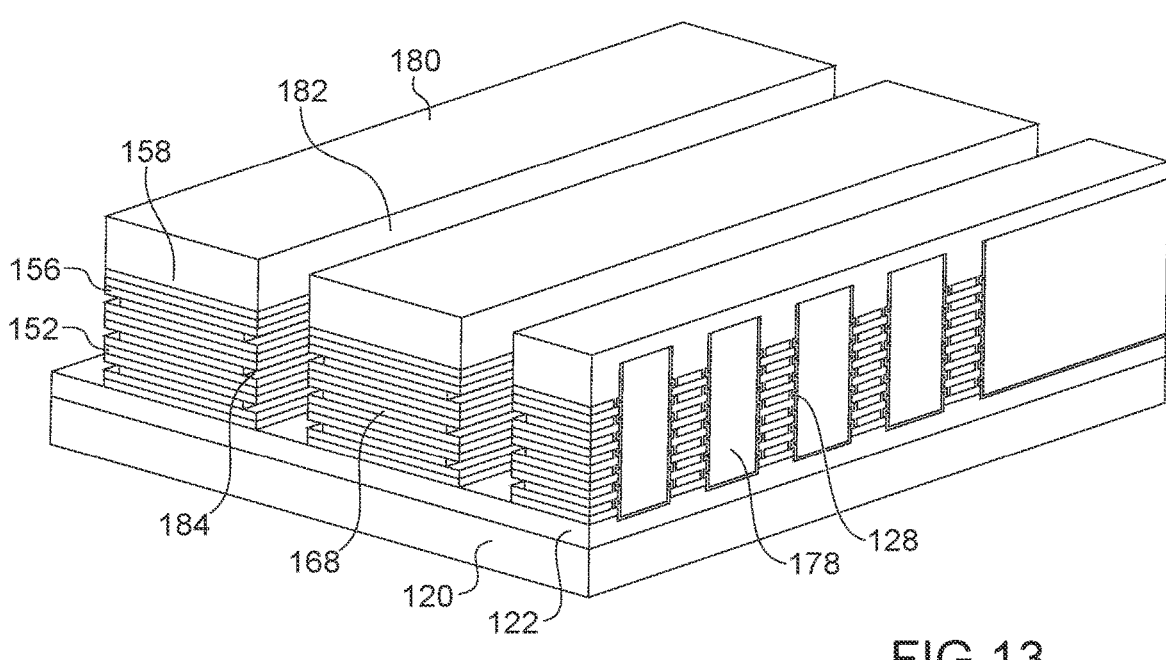
Figure 14:
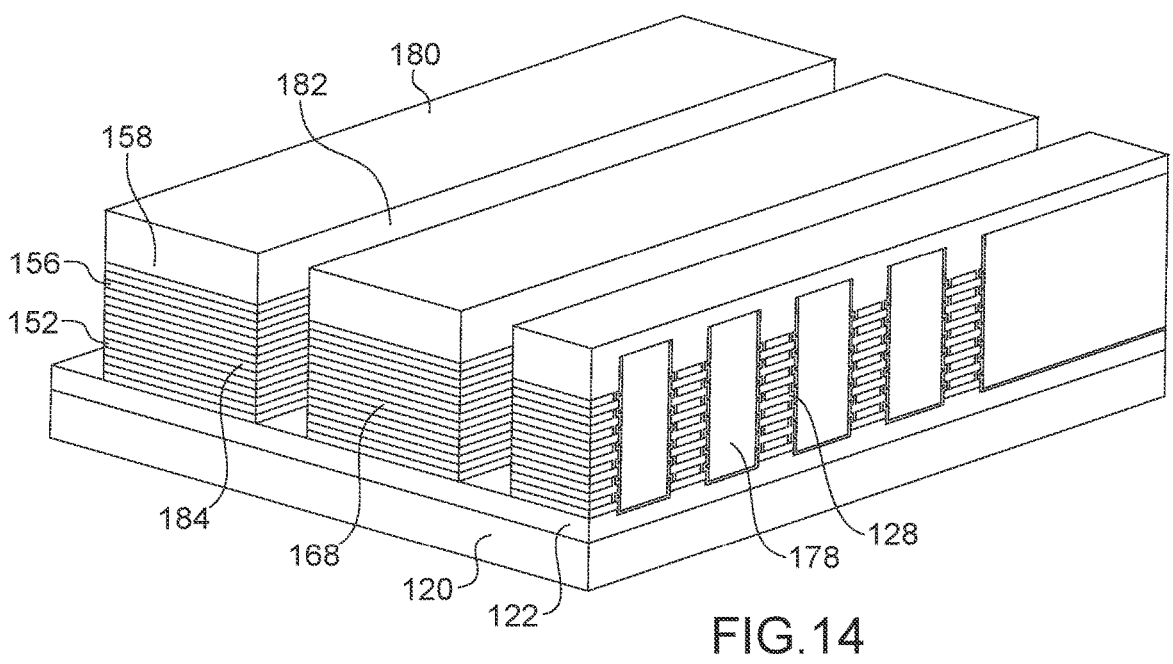
Figure 15:
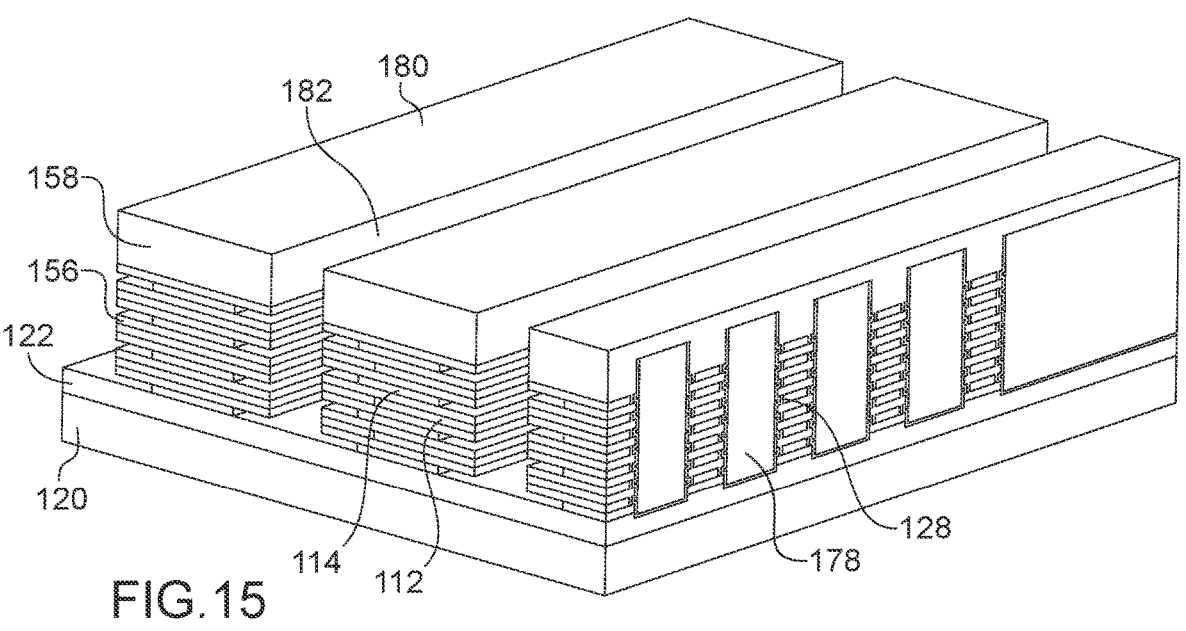

Afterwards, a new etching step is implemented throughout the entire thickness of the stack 150 (cf. FIG. 12). This fourth etching step forms trenches 182 separating and electrically insulating different portions of the stack 150 in each of which the 3D lines of the memory 100 will be made, i.e. the superimposed lines of memory elements 102 and the superimposed lines of the access transistors 104 of the memory 100. Each of these portions of the stack 150 includes a line of first cavities 160 at the end of which one lies one of the second cavities 162, filled with the sacrificial material of the layer 178. For example, this etching is implemented while having formed beforehand the pattern of the trenches 182 in the first and second hard mask layers 158, 180. This etching is stopped on the buried dielectric layer 122.

In the embodiment shown in FIG. 12, the trenches 182 are etched through the portions 166 of the second layers 154, and a portion of these portions 166 of the second layers 154 is present over the edges of the remaining portions of the stack 150 that are located next to the trenches 182. A selective etching of remaining portions 166 is then implemented to suppress them (cf. FIG. 13). Afterwards, the recesses or spaces 184 obtained upon completion of this etching are filled by the deposition of a dielectric material similar to that of the dielectric portions 168, herein SiN (cf. FIG. 14). For example, the deposited dielectric material has a thickness equal to 10 nm (or more depending on the depth of the recesses or spaces 184 to be filled), and the portions of this material located outside the recesses or spaces 184 are suppressed by another selective etching. This deposited dielectric material forms, together with the dielectric portions 168, the portions 112 intended to ensure the electrical insulation between the gates of the superimposed access transistors 104 in the different memory levels.

Alternatively, it is possible that the previous etching step forming the trenches 182 completely suppresses the remaining portions of the second layers 154 (by making trenches 182 wider than those shown in FIG. 12). In this case, the etching forming the recesses 184 and the deposition of the dielectric material in the recesses 184 are not implemented, and the remaining portions of the dielectric portions 168 form the insulation dielectric portions 112.

Afterwards, the portions of the first layers 152 present in each of the portions of the stack 150 insulated by the trenches 182 are partially etched so that the remaining portions of the first layers 152 form the nanowires 114 of the access transistors 104. For example, this etching corresponds to a selective dry or wet etching of the semiconductor of the first layers 152 with regards to the other present materials. This etching step allows defining the width of the nanowires 114 (dimension according to the X axis in the example of FIG. 15).

Afterwards, another selective etching step is implemented to suppress the portions of the third layers 156 present over and beneath the nanowires 114, then the gates are made in the empty spaces present all around the portions of the nanowires 114 intended to form the channels of the access transistors 104. These gates include the material(s) forming the gate dielectric 124 disposed against the semiconductor of the nanowires 114 and the gate conductive material(s) 126 covering the gate dielectric 124. In the embodiment described herein, the gate dielectric 124 is formed by a $HfO_2$ (or alternatively $SiO_2$ or $Al_2O_3$ or any other high dielectric permittivity or "High-k" material) layer with a thickness for example equal to 2 nm and the gate conductive material 126 is formed by a TiN layer, or any other metallic layer that could be deposited by CVD or ALD, with a thickness for example equal to 10 nm. The gate dielectric material portions 124 deposited at the bottom the trenches 182 are kept, and those of the gate conductive material 126 deposited at the bottom of the trenches 182 is etched, for example by implementing a wet etching with stopping on the portions of the gate dielectric 124 present at the bottom of the trenches 182.

The deposition of the gate conductive material(s) 126 also forms the word lines 110 which electrically connect together the gates of the access transistors 104 located in the same level of the memory 100 and in the same 3D line of the memory 100.

Figure 16:
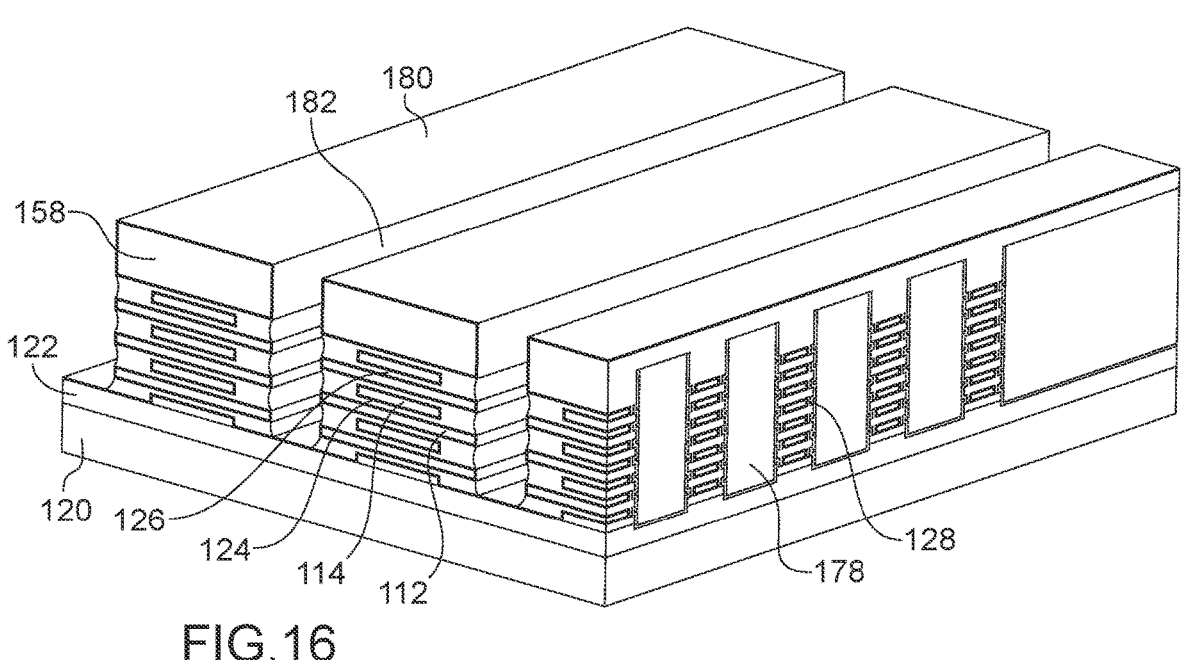

The structure obtained at this point of the method is shown in FIG. 16.

Figure 17:
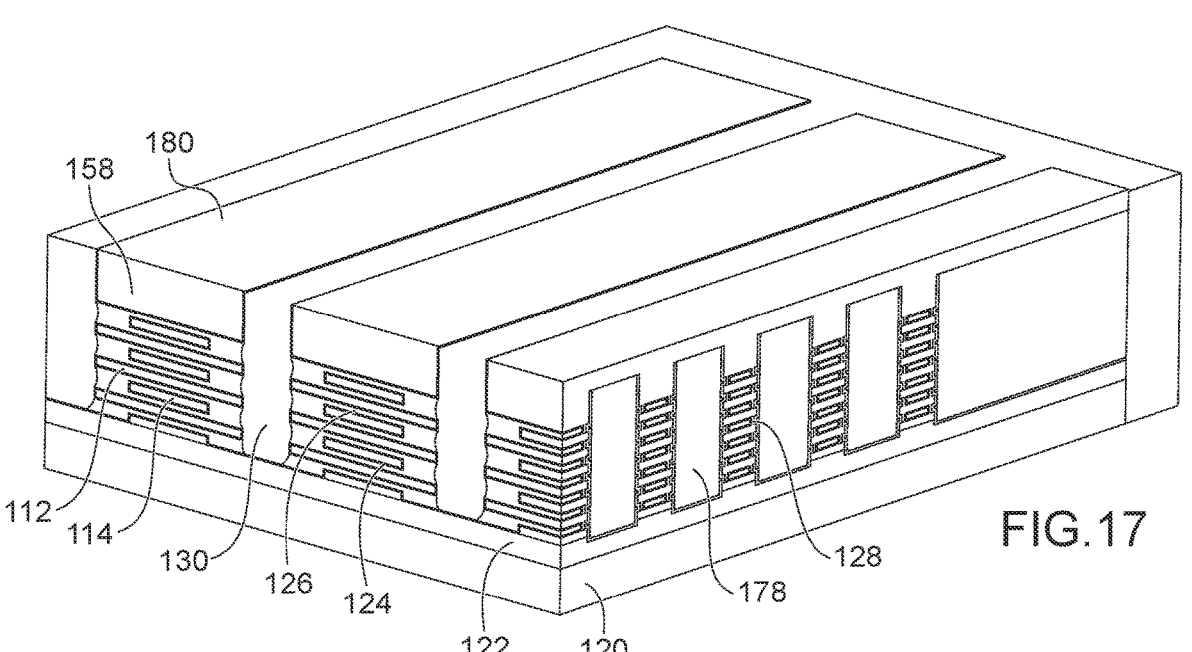

Afterwards, the trenches 182 are filed with a dielectric material, for example an oxide such as TEOS or HDP oxide, which then undergoes a CMP so that the remaining portions of this dielectric material form the insulation dielectric elements 130 intended to ensure the electrical insulation between the different 3D lines of the memory 100 (cf. FIG. 17). For example, the deposited dielectric material layer has a thickness equal to 500 nm, or more generally a thickness larger than the minimum thickness required to fill the trenches 182. The CMP is implemented with stopping on the second hard mask layer 180.

Figure 18:
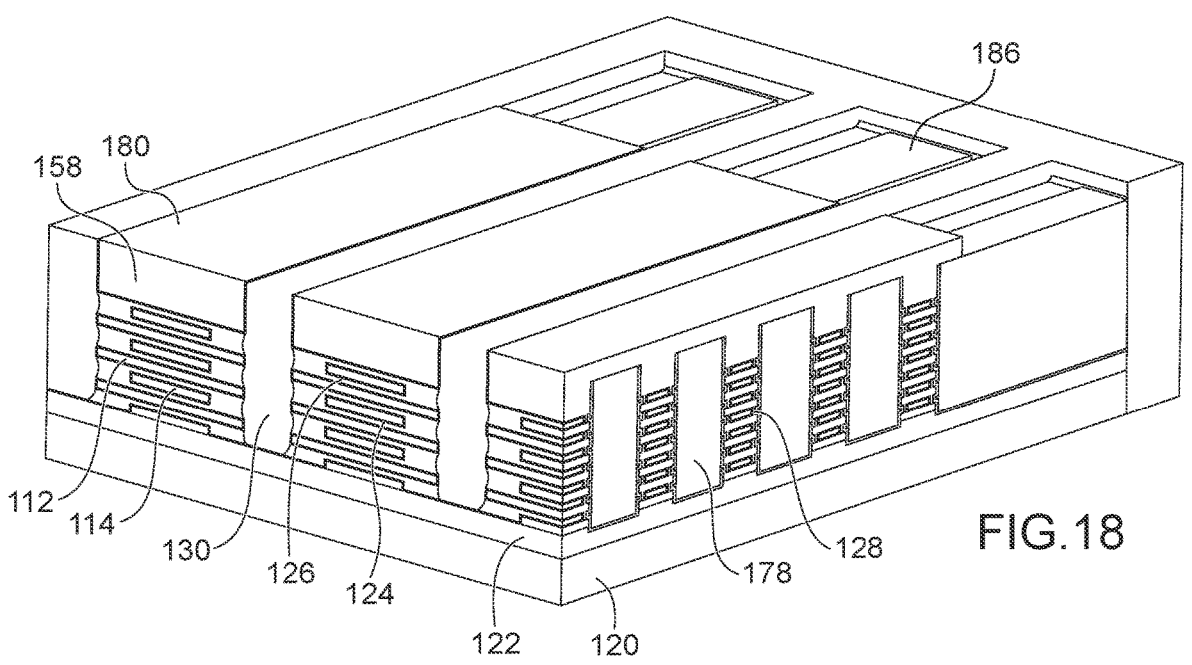

Afterwards, portions of the first and second hard mask layers 158, 180 are etched to form accesses to the portions of the sacrificial material layer 178 present in the second cavities 162. In FIG. 18, the openings formed through the hard mask layers 158, 180 bear the reference 186. These openings 186 are made by lithography and etching.

Figure 19:
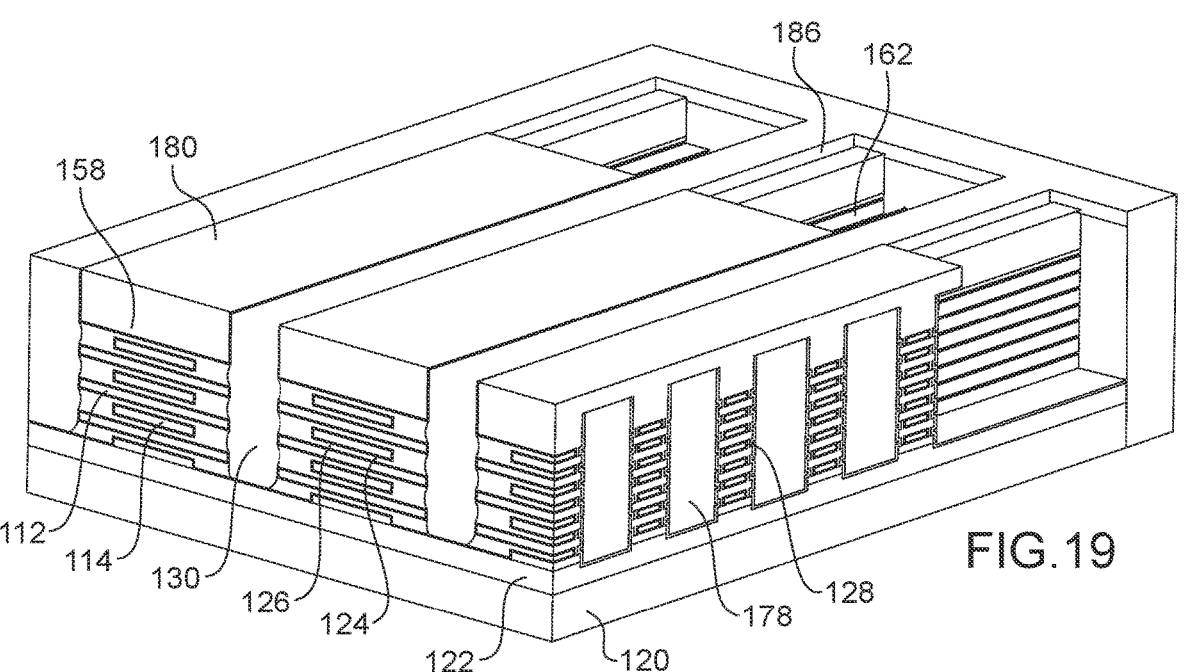

Etching, for example dry or wet etching, is implemented to suppress the portions of the sacrificial material layer 178 present in the second cavities 162 (cf. FIG. 19). This etching clears the second cavities 162 which become accessible from the openings 186. The gate material present in the second cavities 162 is not etched during this step.

Figure 20:
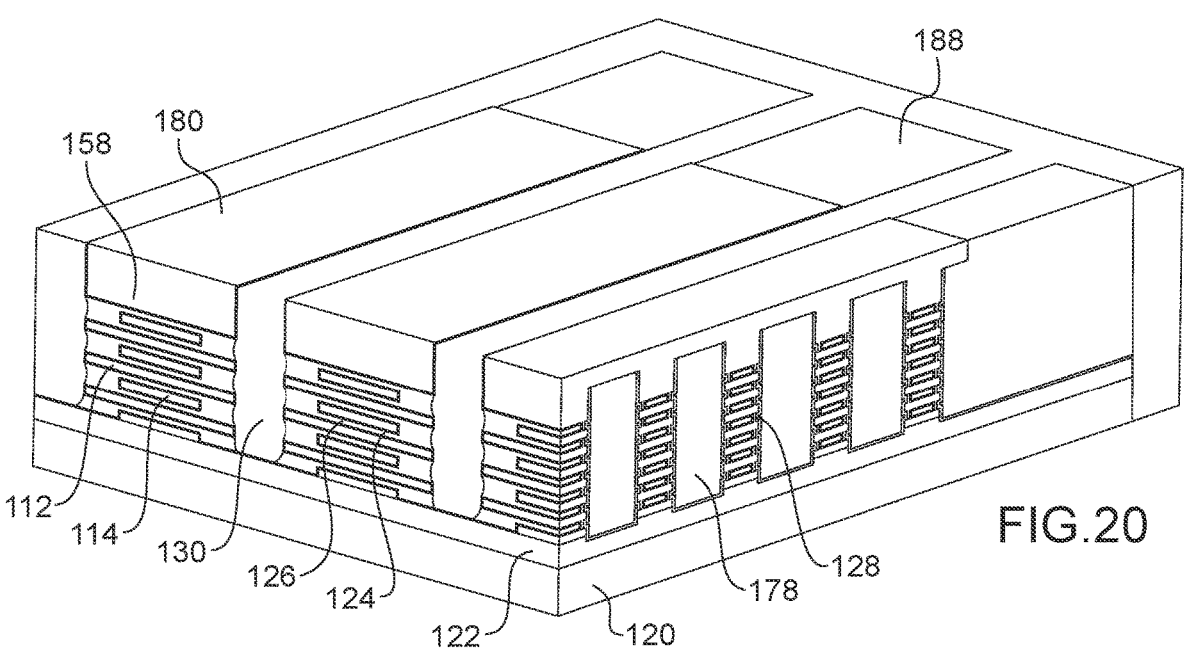
Figure 21:
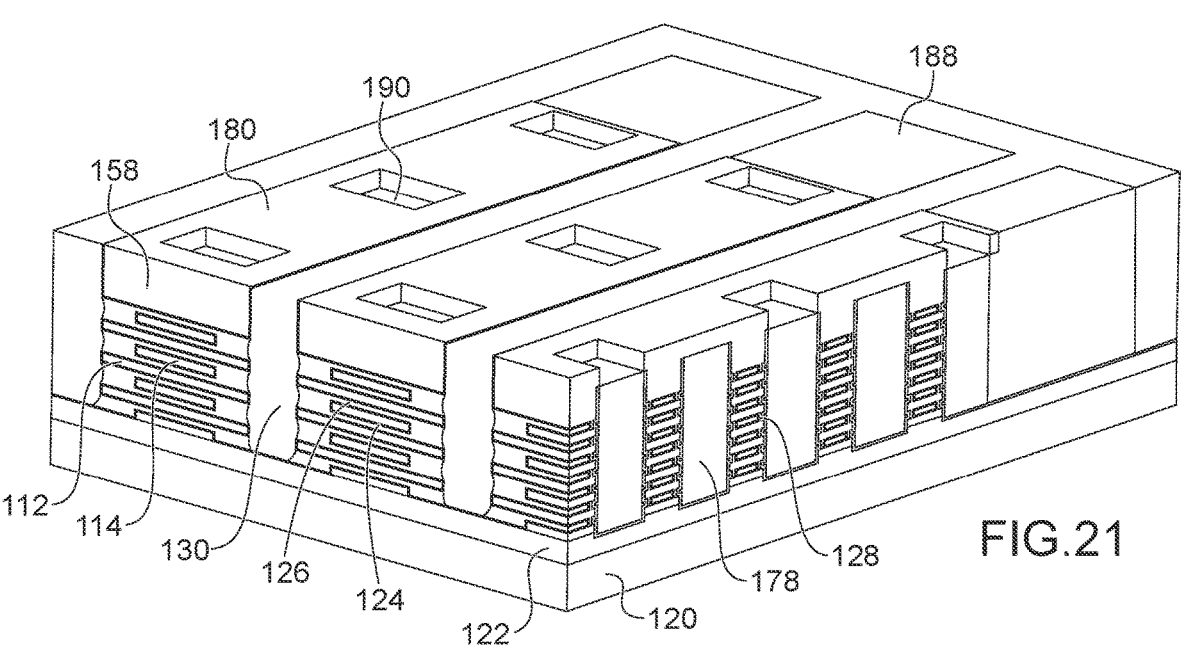

Afterwards, the second cavities 162 are filled with a dielectric material 188 similar to that of the dielectric portions 130, which is deposited, then planarised by a CMP stopped on the material of the layer of the second hard mask 180 (cf. FIG. 20). Afterwards, openings 190 are formed through the hard mask layers 158, 180 in order to form accesses to the portions of the sacrificial material layer 178 located in some of the first cavities 160 in which the first electrically-conductive portions 116 are intended to be made (cf. FIG. 21).

Figure 22:
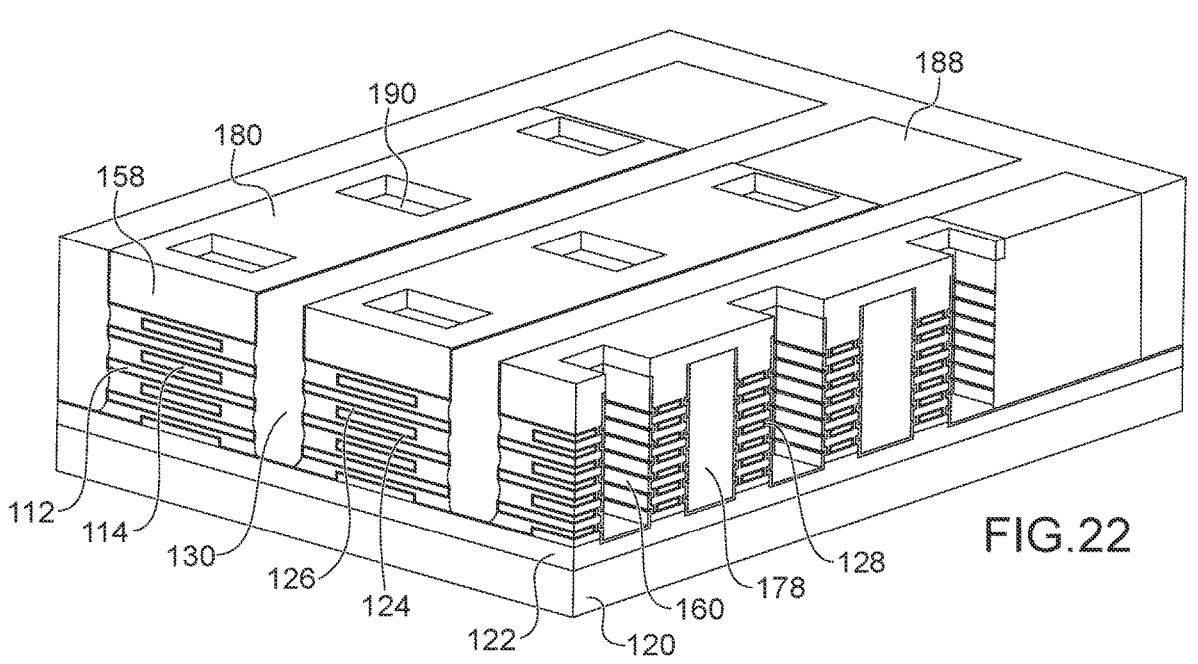

Afterwards, a wet etching is implemented to suppress the portions of the sacrificial material layer 178 accessible through the openings 190, thereby clearing the first cavities 160 in which the first electrically-conductive portions 116 are intended to be made (cf. FIG. 22).

Figure 23:
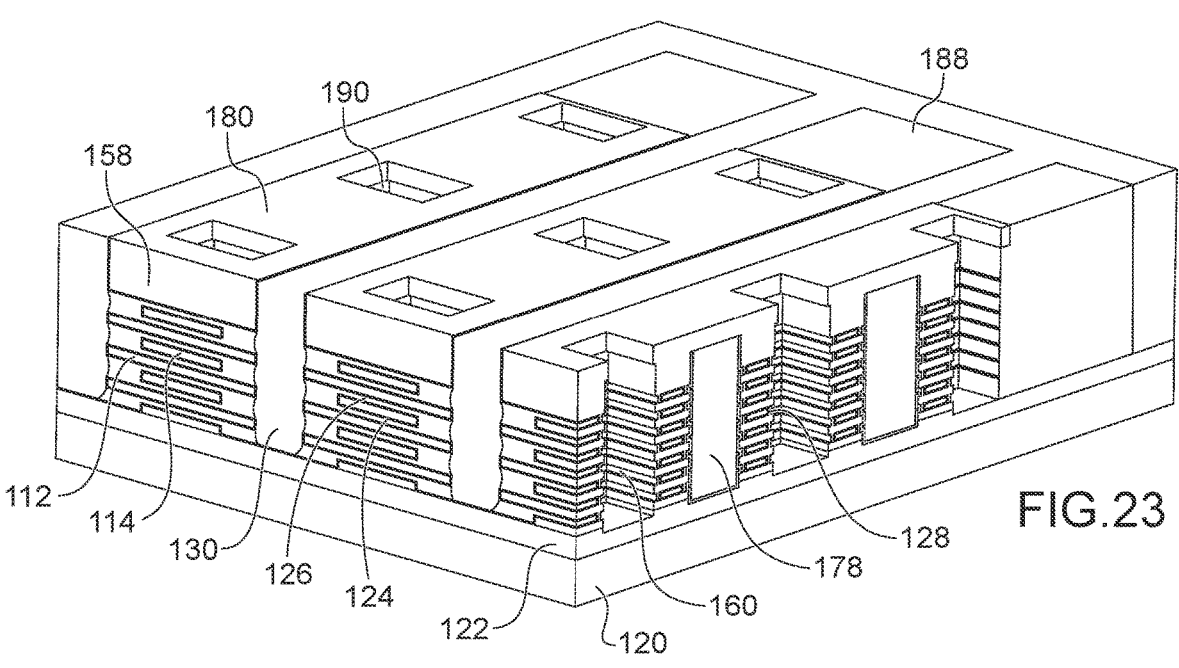

Afterwards, the portions of the dielectric layer 176 present in the cleared first cavities 160 are etched, thereby making in particular the first ends of the nanowires 114 accessible from these cleared first cavities 160 (cf. FIG. 23).

Figure 24:
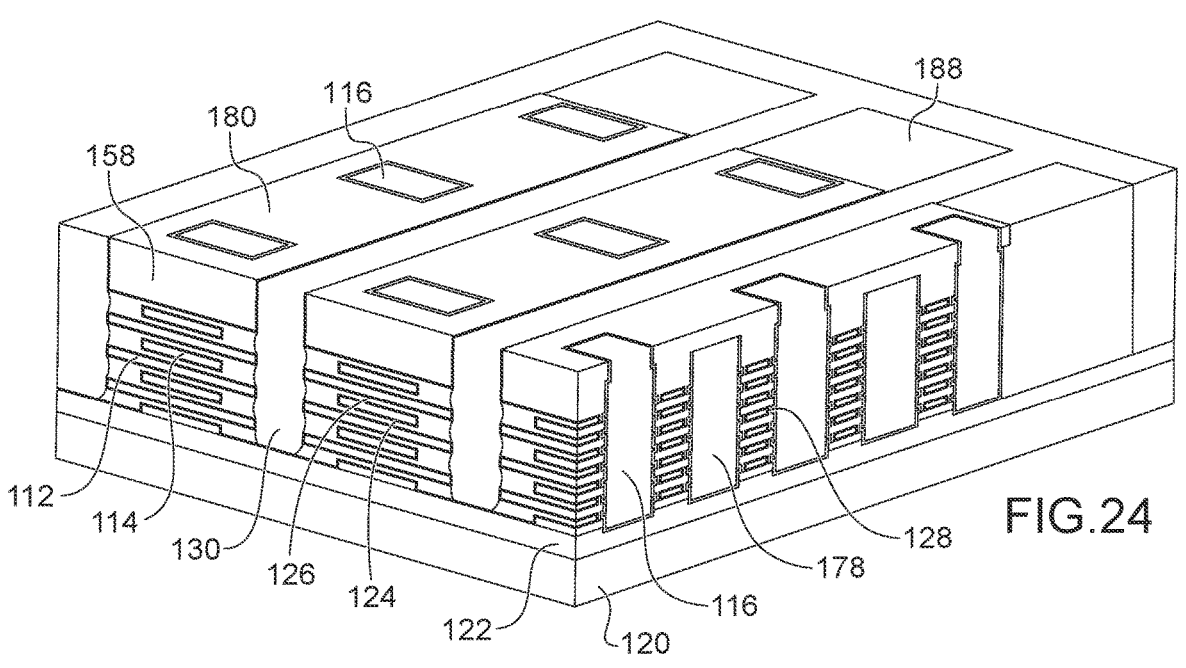
Figure 25:
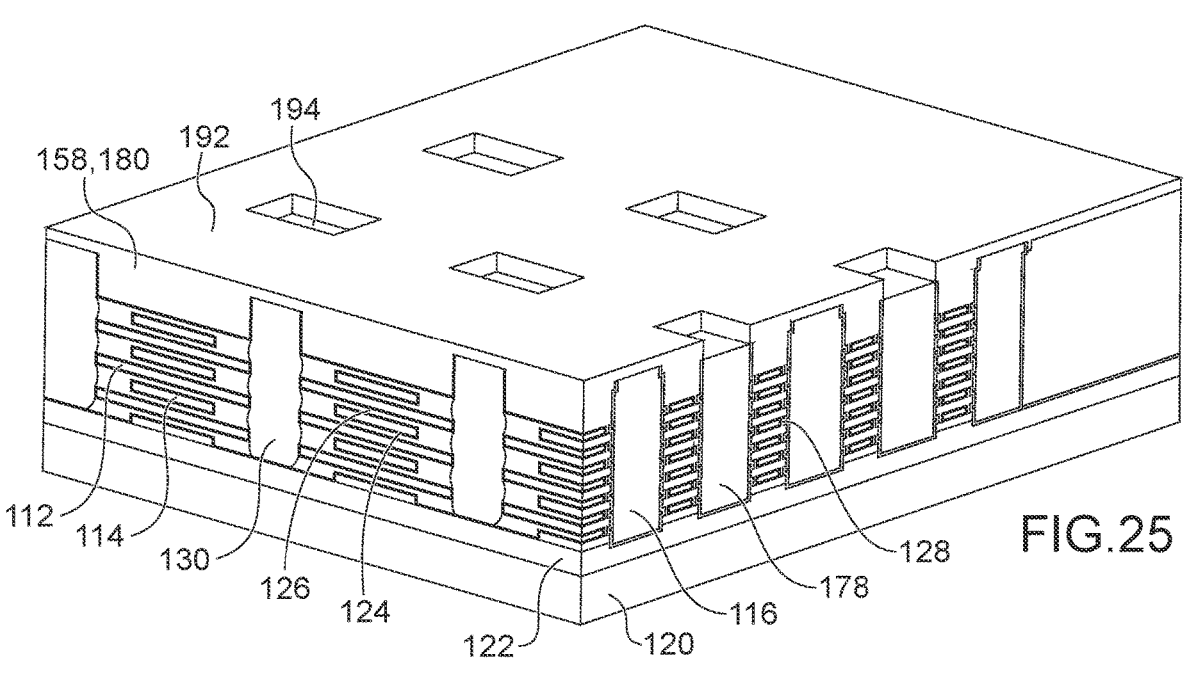

Afterwards, the first electrically-conductive portions 116 are made in the cleared first cavities 160 and in the openings 190 (cf. FIG. 24). In the embodiment described herein, the first electrically-conductive portions 116 are formed by successive conformal depositions, for example CVD, of several electrically-conductive layers, for example a first Ti layer with a thickness equal to 5 nm, a second TiN layer with a thickness equal to 5 nm, then filling of the remaining spaces of the cleared first locations 160 with a third W layer. Afterwards, a CMP is implemented, with stopping on the layer of the second hard mask 180, to suppress the portions of these layers deposited over the layer of the second hard mask 180. In the embodiment described herein, the first electrically-conductive portions 116 are intended to form the source electrodes of the access transistors 104.

Optionally, prior to making of the first electrically-conductive portions 116, it is possible to implement an epitaxy of the source and drain regions of the transistors in the first cavities 160.

A new hard mask layer 192 is made in particular in order to cover the first electrically-conductive portions 116. Afterwards, openings 194 are formed through the hard mask layers 158, 180, 192 in order to form accesses to the portions of the sacrificial material layer 178 located in the other first cavities 160 in which the second electrically-conductive portions 118 and the memory elements 102 are intended to be made (cf. FIG. 25).

Figure 26:
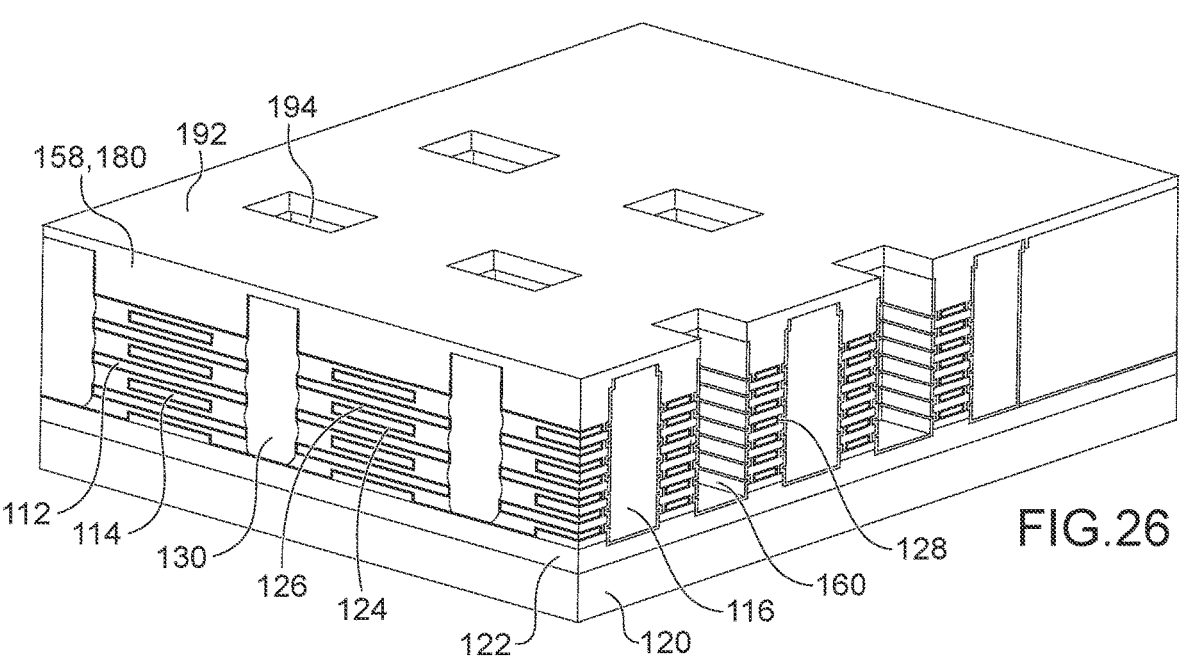

Afterwards, a wet etching is implemented to suppress the portions of the sacrificial material layer 178 accessible through the openings 194, thus clearing the first cavities 160 in which the second electrically-conductive portions 118 and the memory elements 102 are intended to be made (cf. FIG. 26).

Figure 27:
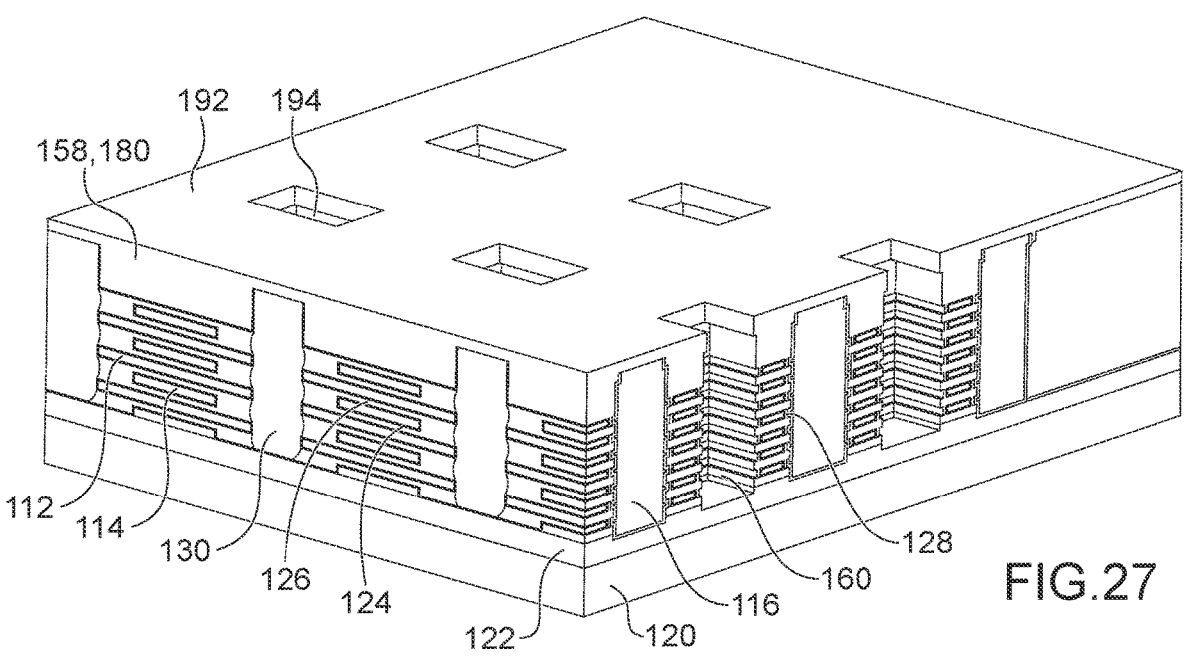

Afterwards, the portions of the dielectric layer 176 have in the previously cleared first cavities 160 are etched, making in particular the second ends of the nanowires 114 accessible from these cleared first cavities 160 (cf. FIG. 27).

Afterwards, the electrically-conductive layers 113 intended to form the second electrodes of the memory elements 102 and the memory material layers 115 are conformally deposited in the previously cleared first cavities 160. In the described embodiment, the memory material layer 115 corresponds to a $HfO_2$ layer with a thickness for example equal to 5 nm.

Afterwards, the layer(s) forming the second electrically-conductive portions 118 is/are made in the cleared first cavities 160 and in the openings 194, while covering the memory material layers 115. In the embodiment described herein, the second electrically-conductive portions 118 are formed by successive conformal depositions, for example CVD, of several electrically-conductive layers, for example a first Ti layer with a thickness equal to 5 nm, a second TiN layer with a thickness equal to 5 nm, then filling of the remaining space of the cleared first cavities 160 with a third W layer with a thickness for example equal to 50 nm.

Afterwards, a CMP is implemented, with stopping on the hard mask layer 192, to suppress the portions of these layers deposited over the layer of the hard mask 192. In the embodiment described herein, the second electrically-conductive portions 118 are intended to form the drain electrodes of the access transistors 104.

The method for making the memory 100 is completed by making, within interconnection metallic levels formed on top of the obtained structure, first and second electrically-conductive lines 106, 108. The completed memory 100 corresponds to that shown in FIG. 2.

In the above-described making method, the first electrically-conductive portions 116 are made before the memory stacks forming the memory elements 102. Alternatively, it is possible that the memory stacks are made before the first electrically-conductive portions 116.

Alternatively, it is possible that the nanowires 114 forming the channels of the access transistors 104 include a polycrystalline semiconductor, advantageously polycrystalline silicon. An example of a method for making a memory 100 including such transistors is described hereinbelow with reference to FIGS. 28 to 37.

The formed stack 150 comprises the first layers 152 which herein include polycrystalline silicon, the second layers 154 including for example SiN, and the third layers 156 including for example $SiO_2$.

The second cavities 162 are formed in the stack 150. For this purpose, openings are formed by lithography through the first hard mask layer 158, then etching is implemented through the stack 150 until reaching the buried dielectric layer 122 (cf. FIG. 28).

Figures 28, 29:
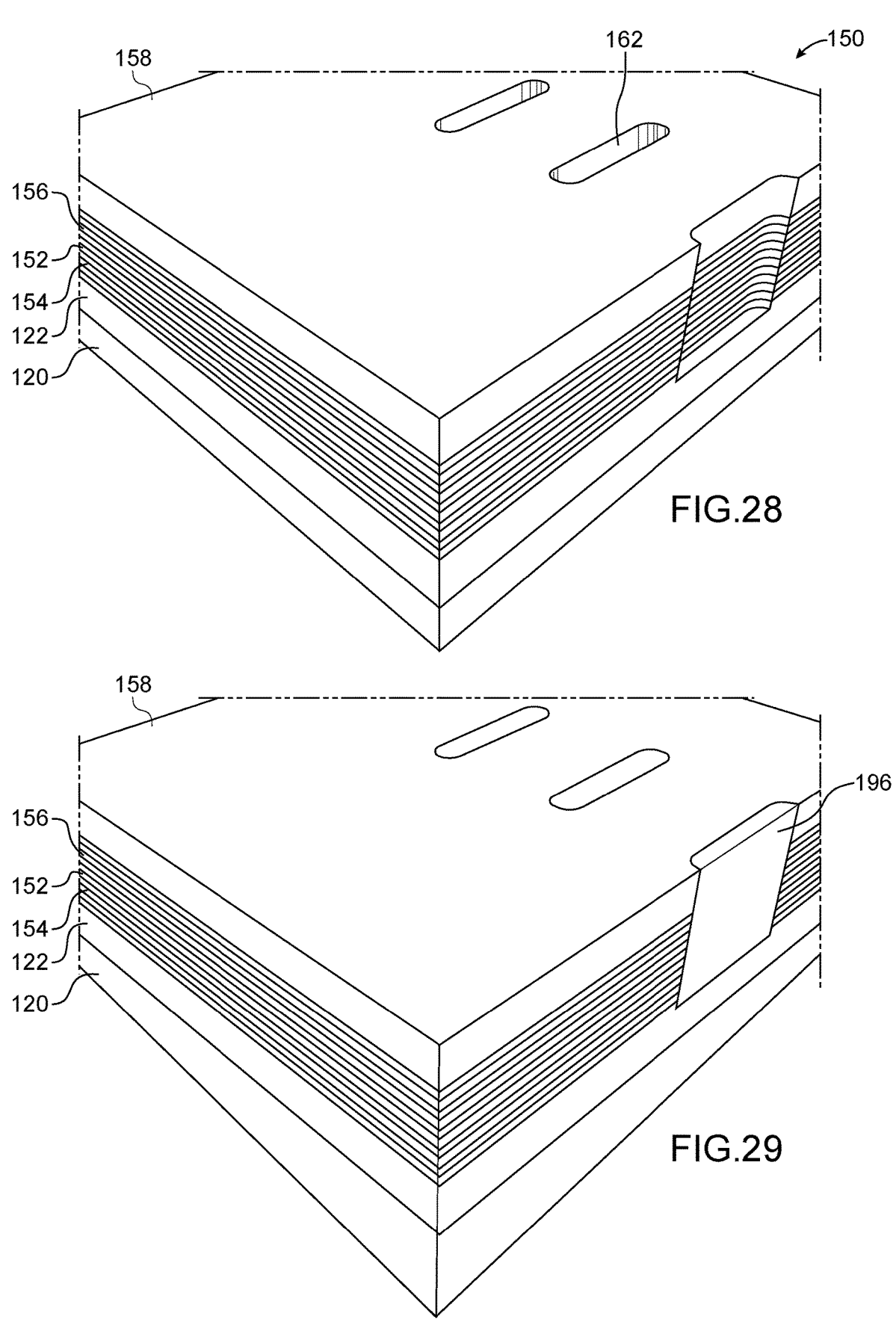
FIGS. 28 to 37 show the steps of a method for making a memory according to one variant.

Afterwards, the second cavities 162 are filled by a HDP oxide deposition (a deposition using a high-density plasma), and a CMP with stopping on the first hard mask layer 158 is implemented (cf. FIG. 29, in which the formed HDP oxide portions bear the reference 196).

Figure 30:
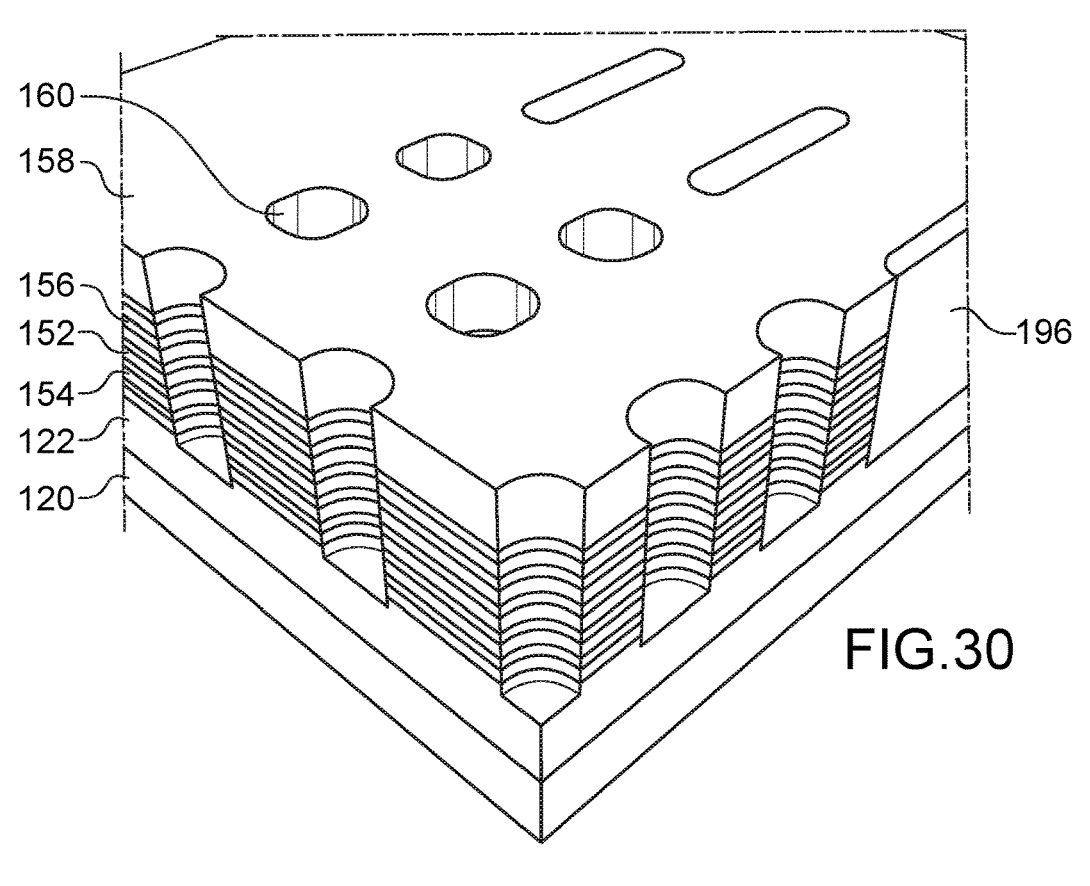

New lithography and etching steps are implemented through the stack 150, until reaching the buried dielectric layer 122, according to a pattern defining the first cavities 160 (cf. FIG. 30).

Figure 31:
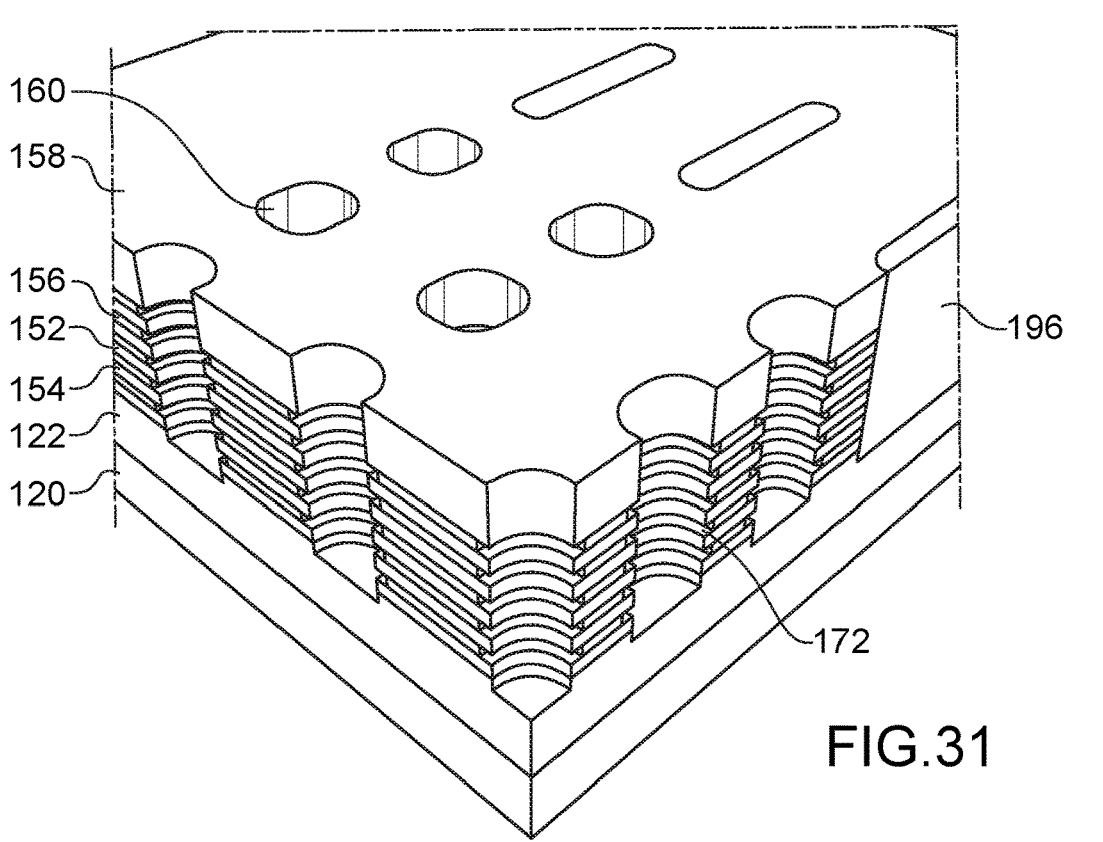

A selective etching of a portion of the third layers 156 is implemented. This etching is selective with regards to the polycrystalline silicon of the first layers 152 and with regards to the SiN of the second layers 154. This etching is carried out so as to obtain, in the cavities 160, a removal of the material of the third layers 156, with respect to the surface from which the material is etched, over a depth for example equal to 20 nm. In FIG. 31, the recesses formed in the third layers 156 bear the reference 172.

Afterwards, the dielectric material(s) intended to form the inner spacers 128 is/are deposited. Like in the previously-described embodiment, a dielectric material layer is conformally deposited in the cavities 160 so as to partially fill the recesses 172, and also covers the first hard mask layer 158. For example, this dielectric material layer includes SiN and has for example a thickness equal to 9 nm. Afterwards, a wet etching is implemented to suppress the portions of this dielectric material layer which are not located in the recesses 172 and which do not form the inner spacers 128, i.e. the portions of the dielectric material layer located against the first hard mask layer 158, at the bottom of the cavities 160, 162 and against the first layers 152 (cf. FIG. 32).

Afterwards, the dielectric material layer 176 is conformally deposited in the cavities 160 and over the first hard mask layer 158. For example, the second dielectric material layer 176 includes TEOS and has for example a thickness equal to 4 nm. Afterwards, the sacrificial material layer 178 that could be etched selectively with regards to the material of the first hard mask layer 158 is deposited so as to fill the cavities 160. This sacrificial material layer 178 covers the second dielectric material layer 176. For example, the sacrificial material layer 178 includes polysilicon. For example, the thickness of the sacrificial material layer 178 is equal to 380 nm.

Figures 32, 33:
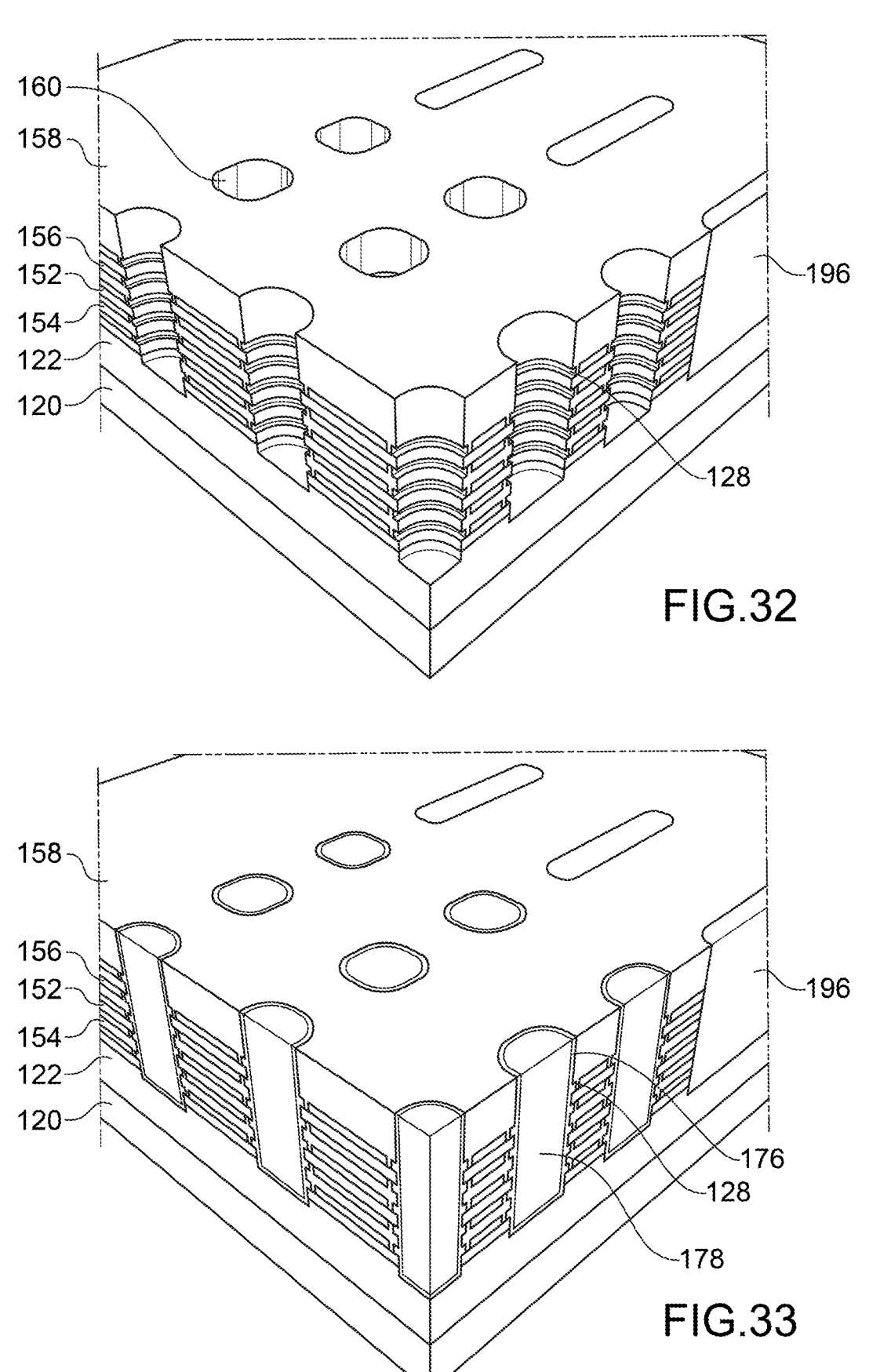

Afterwards, a chemical mechanical polishing (CMP) step is implemented with stopping on the first hard mask layer 158 in order to suppress the sacrificial material of the layers 176 and 178 located on the first hard mask layer 158 (cf. FIG. 33). Upon completion of this CMP step, only the portions of the material layers 176 and 178 located in the cavities 160 are kept.

Figures 34, 35:
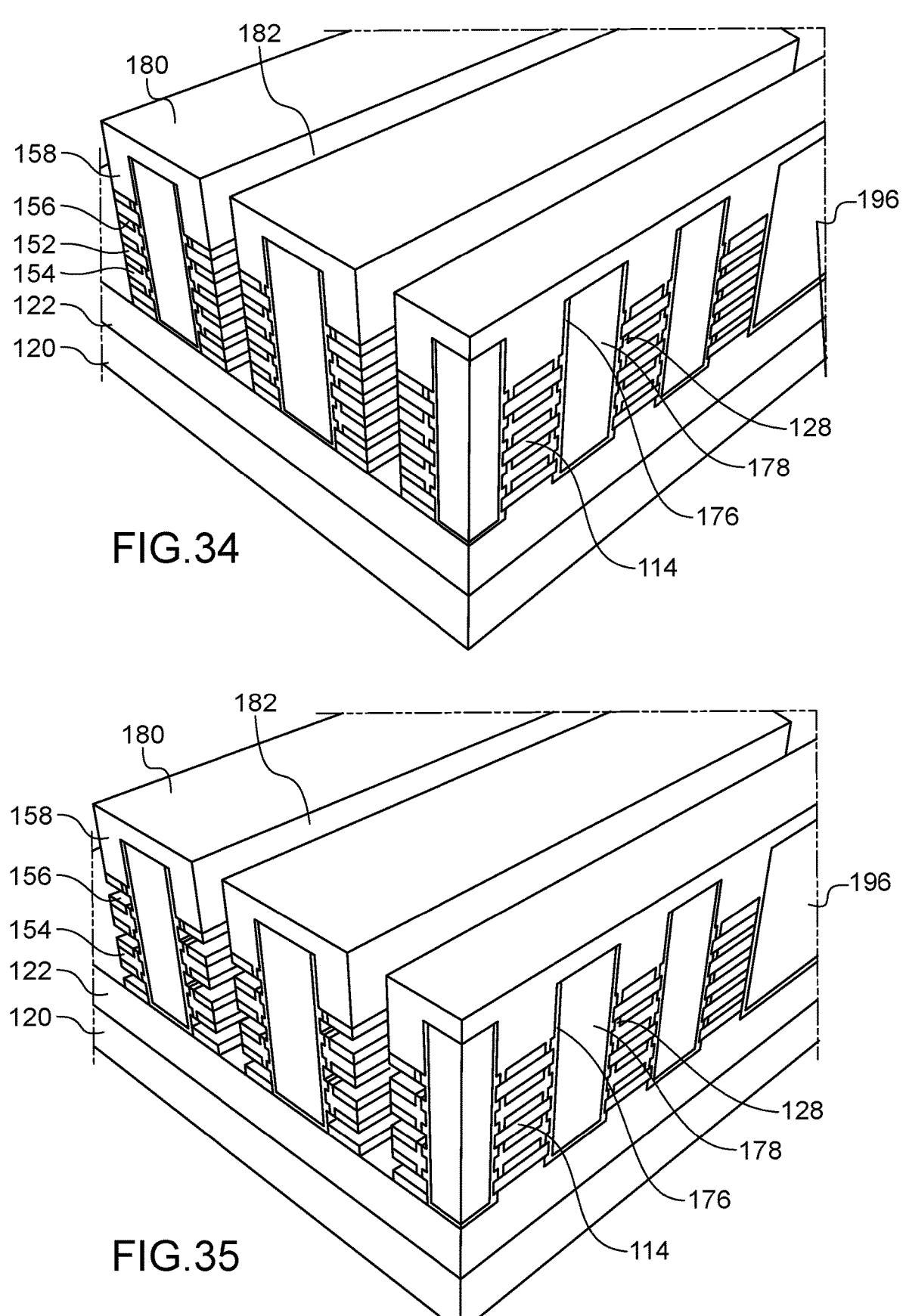

Afterwards, the lines of the memory 100 are electrically insulated from each other through the implementation of lithography and etching steps forming the trenches 182 (cf. FIG. 34).

Afterwards, the portions of the first layers 152 present in each of the portions of the stack 150 insulated by the trenches 182 are partially etched so that the remaining portions of the first layers 152 form the nanowires 114 of the access transistors 104. For example, this etching corresponds to a dry or wet etching, selective with regards to the materials of the layers 154 and 156 (cf. FIG. 35).

Figure 36:
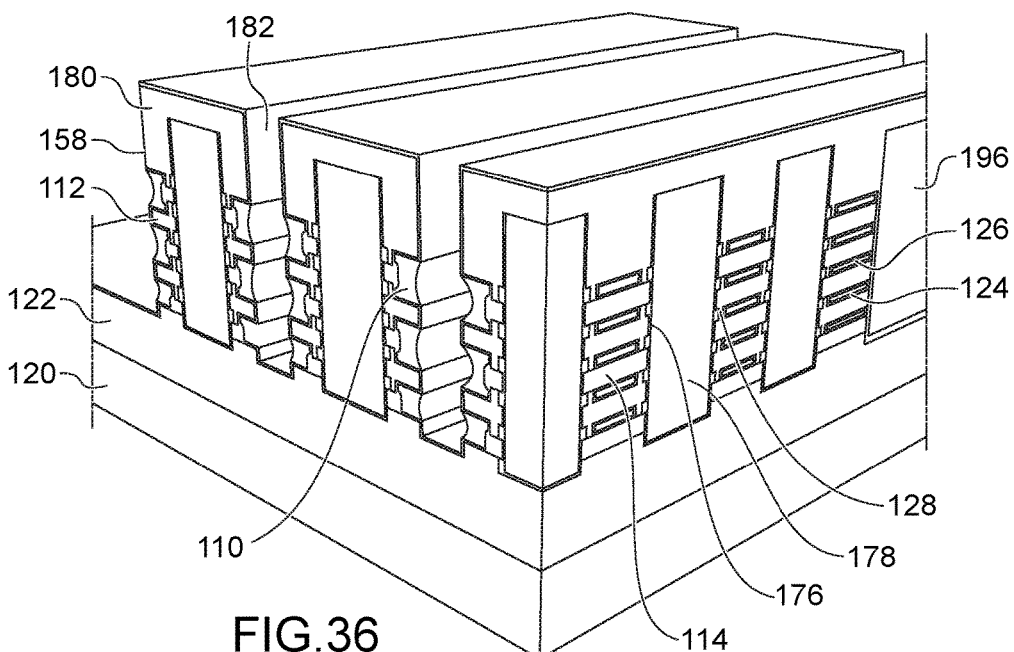

Afterwards, another selective etching step is implemented to suppress the portions of the third layers 156 present over and beneath the nanowires 114, then the gates are made in the empty spaces present all around the portions of the nanowires 114 intended to form the channels of the access transistors 104 (cf. FIG. 36). For example, these gates include HfO$_2$ forming the gate dielectric 124 disposed against the semiconductor of the nanowires 114 and TiN forming the gate conductive material 126 covering the gate dielectric 124. Like in the previously-described embodiment, the material portions of the gate dielectric 124 deposited at the bottom of the trenches 182 are kept, and those of the gate conductive material 126 deposited at the bottom of the trenches 182 is etched by an isotropic etching with stopping on the material of the gate dielectric 124.

The deposition of the gate conductive material(s) 126 also forms the word lines 110 which electrically connect together the gates of the access transistors 104 located in the same level of the memory 100 and in the same 3D line of the memory 100.

Afterwards, the portions of the layers 176 and 178 present in the first cavities in which the first electrically-conductive portions 116 are intended to be made are etched, and a step of epitaxy of source and drain regions is implemented to form one of the source and drain regions 198 of each access transistor 104.

Figure 37:
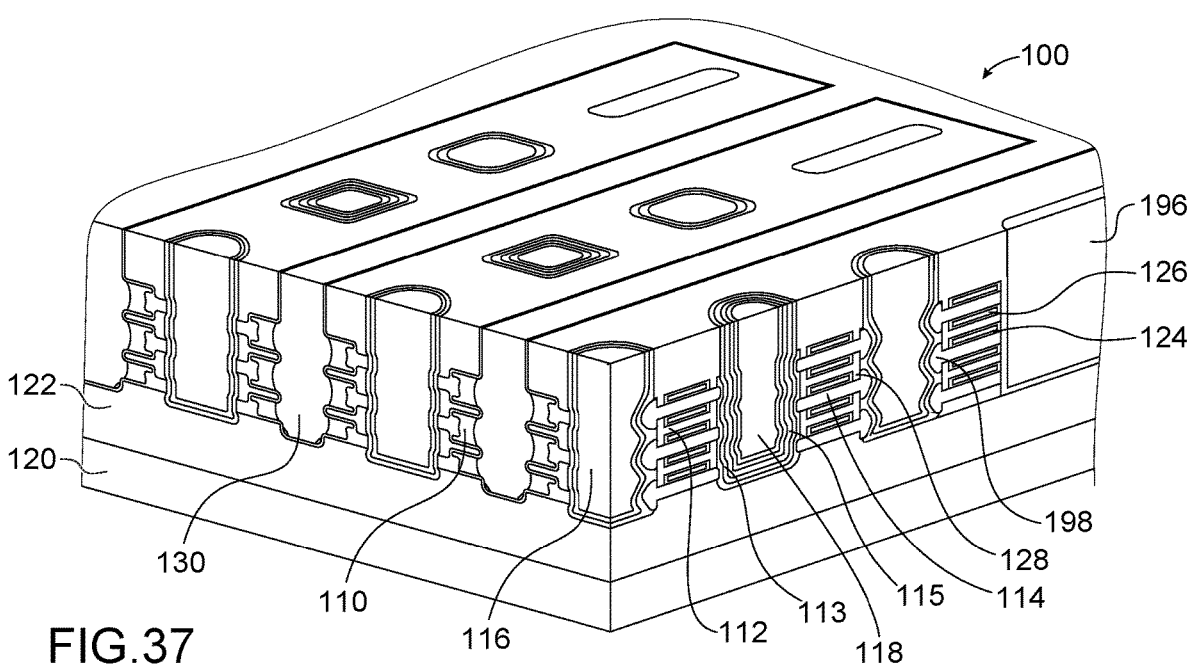

Afterwards, the memory 100 is completed like in the previously-described embodiment, by making in particular the first electrically-conductive portions 116, the memory elements 102 and the second electrically-conductive portions 118 (cf. FIG. 37).

The invention claimed is:

1. A memory including a structure having lines and columns over several superimposed memory levels, each memory level comprising at least one array of memory elements and gate-all-around access transistors, each gate-all-around access transistor including a semiconductor nanowire at least one portion of which is embedded by a gate, each gate being electrically insulated from the gates of the gate-all-around access transistors of the other memory levels, the memory comprising:

first electrically-conductive portions, each crossing at least two memory levels and being electrically coupled to first ends of the semiconductor nanowires of gate-all-round access transistors belonging to at least one column and one line of each of said at least two memory levels;

memory stacks, each crossing said at least two memory levels and forming memory elements belonging to at least one column and one line of each of said at least two memory levels, each memory stack comprising at least one memory material layer crossing said at least two memory levels, said at least one memory material layer being disposed between at least one second electrically-conductive portion crossing said at least two memory levels, said at least one second electrically-conductive portion forming a first electrode of said memory elements and at least one electrically-conductive layer forming a second electrode of said memory elements, the electrically-conductive layer crossing said at least two memory levels, and said electrically-conductive layer being disposed against second ends of the semiconductor nanowires of said gate-all-around access transistors belonging to at least one column and one line of each of said at least two memory levels;

first electrically-conductive lines, each being electrically connected to the first electrically-conductive portions of the same column of the memory;

second electrically-conductive lines, each being electrically connected to the second electrically-conductive portions of the same column of the memory; and word lines each extending in the same memory level corresponding to one of said at least two memory levels while electrically coupling together the gates of the access transistors of the same line of the memory and located in said memory level.

2. The memory according to claim 1, wherein the semiconductor nanowires of the gate-all-around access transistors include polycrystalline or monocrystalline silicon or metal oxide or at least one semiconductor 2D material.

3. The memory according to claim 1, wherein the memory material corresponds to a resistive or magnetoresistive or phase-change or ferroelectric material.

4. The memory according to claim 1, wherein each of the word lines of a line of the memory is electrically insulated from the other word lines belonging to the line of memory.

5. The memory according to claim 4, wherein, in each line of the memory, the word lines are located at one end of the line of the memory, electrically insulated from each other, and configured to be connected to a gate electrical contact.

6. The memory according to claim 1, wherein each of the word lines of one line of the memory is electrically insulated from the word lines belonging to other lines of the memory.

7. The memory according to claim 1, wherein the first and second electrically-conductive lines belong to interconnection metallic levels distinct from the memory levels.

8. The memory according to claim 1, further including insulation dielectric portions interposed between superimposed gates and disposed in two neighbouring memory levels.

9. The memory according to claim 1, further including insulation dielectric elements crossing all memory levels and each separating two neighbouring lines of the memory.

10. The memory according to claim 1, wherein:

each of the first electrically-conductive portions crosses all memory levels and is electrically coupled to the first ends of the semiconductor nanowires of gate-all-around access transistors of each of the memory levels;

each of the memory stacks crosses all memory levels and forms memory elements of each of the memory levels; and the word lines extend in each of the memory levels.

11. The memory according to claim 1, wherein in each line of the memory, two memory elements are disposed adjacent to each other and opposing ends of the two memory elements are connected to a same second electrically-conductive portion.

12. The memory according to claim 1, wherein the first and second electrically-conductive lines longitudinally extend in a first direction parallel to each other, and the word lines longitudinally extend in a second direction crossing the first direction.

13. A memory including a structure having lines and columns over several superimposed memory levels, each memory level comprising at least one array of memory elements and gate-all-around access transistors, each gate-all-around access transistor including a semiconductor nanowire at least one portion of which is embedded by a gate, each gate being electrically insulated from the gates of the gate-all-around access transistors of the other memory levels, the memory comprising:

first electrically-conductive portions, each crossing at least two memory levels and each being electrically coupled to a first end of a first nanowire of a first memory level and being coupled to a first end of a second nanowire of a second memory level, the first memory level and the second memory level being superimposed, the first nanowire and the second nanowire being superimposed;

memory stacks, each crossing said at least two memory levels and forming memory elements, each memory stack comprising at least one memory material layer crossing said at least two memory levels and being disposed between at least one second electrically-conductive portion forming a first electrode of said memory elements and at least one electrically-conductive layer forming a second electrode of said memory elements, said electrically-conductive layer and said least one second electrically-conductive portion each crossing said at least two memory levels, the electrically-conductive layer being arranged against a second end of said first nanowire and being arranged against a second end of said second nanowire;

first electrically-conductive lines, each being electrically connected to the first electrically-conductive portions of the same column of the memory;

second electrically-conductive lines, each being electrically connected to the second electrically-conductive portions of the same column of the memory; and word lines each extending in the same memory level corresponding to one of said at least two memory levels while electrically coupling together the gates of the access transistors of the same line of the memory and located in said memory level.

14. The memory according to claim 13, wherein the first and second electrically-conductive lines longitudinally extend in a first direction parallel to each other, and the word lines longitudinally extend in a second direction crossing the first direction.

* * * * *